(12) United States Patent
Vandenameele et al.

(10) Patent No.: US 11,799,425 B2
(45) Date of Patent: Oct. 24, 2023

(54) MIXER AND METHOD FOR GENERATING AN OUTPUT SIGNAL FROM AN INPUT SIGNAL

(71) Applicant: Huawei Technologies Co., Ltd., Shenzhen (CN)

(72) Inventors: Patrick Vandenameele, Munich (DE); Koen Cornelissens, Leuven (BE); Pieter Nuyts, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/069,551

(22) Filed: Oct. 13, 2020

(65) Prior Publication Data
US 2021/0119581 A1  Apr. 22, 2021

Related U.S. Application Data

(63) Continuation of application No. 15/684,074, filed on Aug. 23, 2017, now abandoned, which is a (Continued)

(51) Int. Cl.
*H03D 7/16* (2006.01)
*H04B 1/00* (2006.01)

(52) U.S. Cl.
CPC ........... *H03D 7/165* (2013.01); *H04B 1/0007* (2013.01)

(58) Field of Classification Search
CPC ................................. H03D 7/165; H04B 1/007
See application file for complete search history.

(56) References Cited

U.S. PATENT DOCUMENTS 9,093,982 B2 * 7/2015 Morishita ............ H03H 15/023
2007/0071132 A1 3/2007 May et al.
(Continued)

FOREIGN PATENT DOCUMENTS

CN 103348644 A 10/2013
CN 103828244 A 5/2014
(Continued)

OTHER PUBLICATIONS

Sundstrom et al., "Complex IF Harmonic Rejection Mixer for Non contiguous Dual Carrier Reception in 65 nm CMOS," IEEE Journal of Solid-State Circuits, vol. 48, No. 7, pp. 1659-1668, Institute of Electrical and Electronics Engineers, New York, New York (Jul. 2013).
(Continued)

*Primary Examiner* — Ryan Johnson
*Assistant Examiner* — Colleen J O Toole
(74) *Attorney, Agent, or Firm* — Leydig, Voit & Mayer, Ltd.

(57) ABSTRACT

The invention relates to a mixer for generating an analog output signal $X_{OUT}$ from an analog input signal $X_{IN}$ using a mixing signal having a mixing frequency $f_{MIX}$, the mixer comprising: a scaler being configured to sample the analog input signal $X_{IN}$ at a plurality of discrete points in time k with a sampling frequency $f_S$ to obtain a sampled analog input signal $X_{IN}[k]$ having a continuous signal value, and to generate the analog output signal $X_{OUT}$ having a continuous signal value by scaling the sampled analog input signal $X_{IN}[k]$ on the basis of a plurality of scaling coefficients $A[k]$, wherein the scaling coefficients $A[k]$ are a time-discrete representation of the mixing signal.

11 Claims, 21 Drawing Sheets

Related U.S. Application Data continuation of application No. PCT/EP2015/053815, filed on Feb. 24, 2015.

(56) References Cited

U.S. PATENT DOCUMENTS

| | | |
|---|---|---|
| 2009/0002066 A1 | 1/2009 | Lee et al. |
| 2009/0160577 A1 | 6/2009 | Yoshizawa et al. |
| 2009/0270061 A1 | 10/2009 | Hosokawa et al. |
| 2010/0167669 A1 | 7/2010 | Hosokawa et al. |
| 2012/0201338 A1 | 8/2012 | Leung et al. |
| 2012/0263253 A1 | 10/2012 | Hurwitz et al. |
| 2012/0294299 A1 | 11/2012 | Fernando |
| 2013/0009688 A1 | 1/2013 | Din et al. |
| 2014/0171009 A1 | 6/2014 | Tohidian et al. |
| 2014/0194081 A1 | 7/2014 | Tohidian et al. |

FOREIGN PATENT DOCUMENTS

| | | |
|---|---|---|
| JP | 2007174629 A | 7/2007 |
| JP | 2009174629 A | 8/2009 |
| WO | 2008032635 A1 | 3/2008 |
| WO | 2013189547 A1 | 12/2013 |
| WO | 2014198287 A1 | 12/2014 |

OTHER PUBLICATIONS

Ru et al., "Discrete-Time Mixing Receiver Architecture for RF-Sampling Software-Defined Radio," IEEE Journal of Solid-State Circuits, vol. 45, No. 9, pp. 1732-1745, Institute of Electrical and Electronic Engineers, New York, New York (Sep. 2010).

Gupta et al., "Digital Channelizing Radio Frequency Receiver," IEEE Transactions on Applied Superconductivity, vol. 17, No. 2, pp. 430-437, Institute of Electrical and Electronics Engineers, New York, New York (Jun. 2007).

* cited by examiner

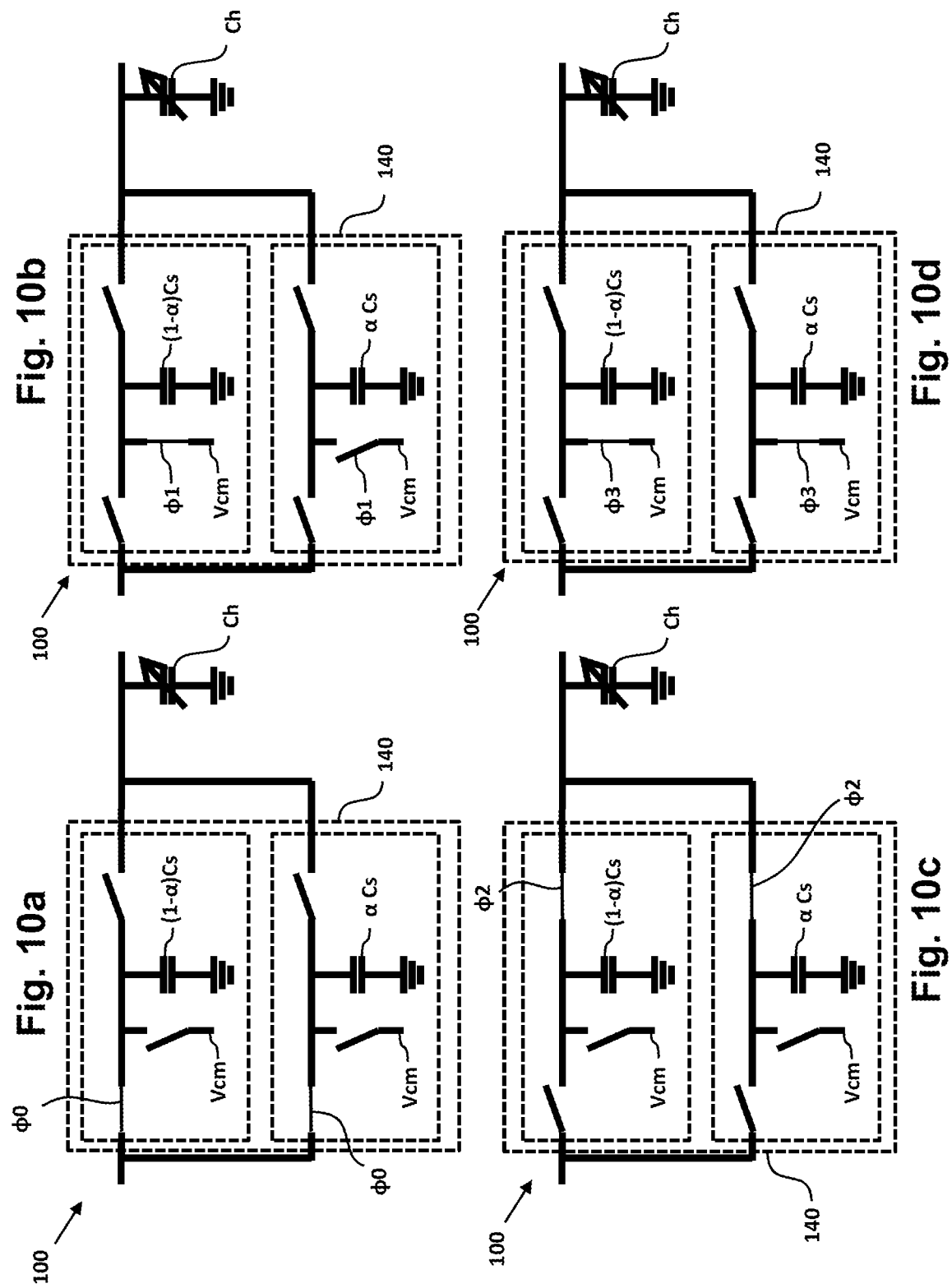

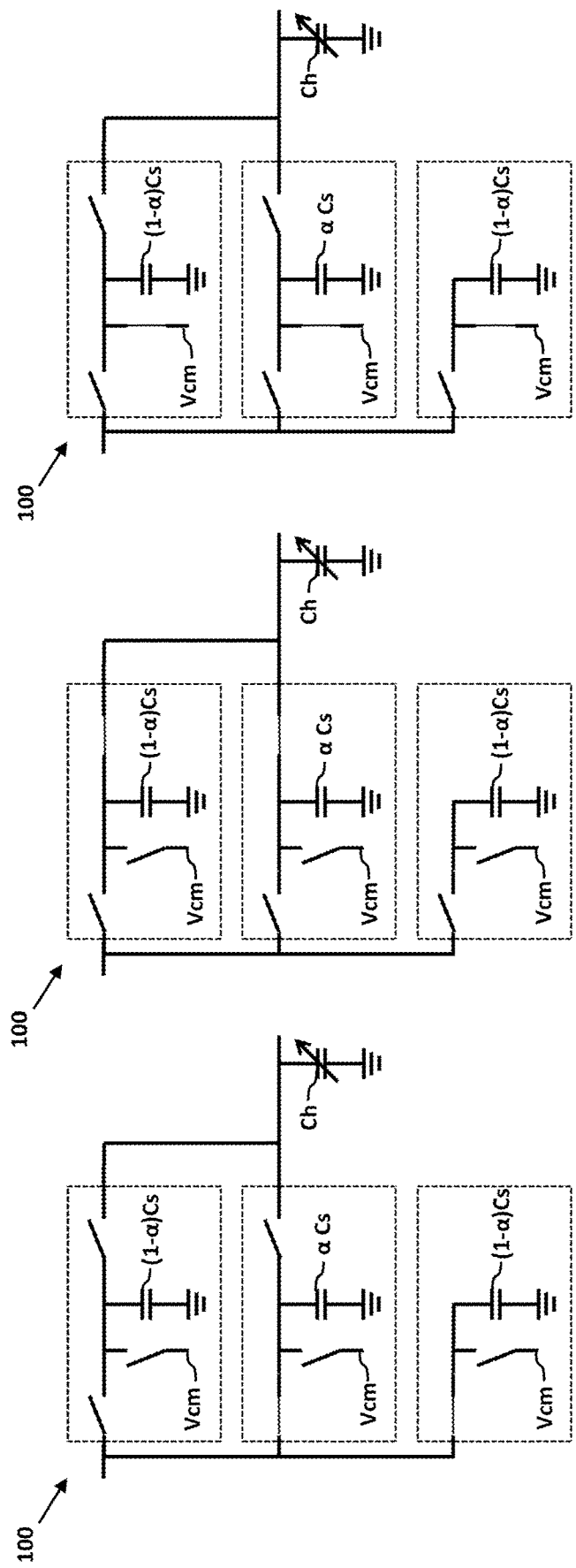

MIXER AND METHOD FOR GENERATING AN OUTPUT SIGNAL FROM AN INPUT SIGNAL

CROSS-REFERENCE TO RELATED APPLICATIONS

This application is a continuation of U.S. patent application Ser. No. 15/684,074, filed on Aug. 23, 2017, which is a continuation of International Application No. PCT/EP2015/053815, filed on Feb. 24, 2015. All of the afore-mentioned patent applications are hereby incorporated by reference in their entireties.

TECHNICAL FIELD

The present invention relates to a mixer for generating an output signal from an input signal using a mixing signal as well as a method for generating an output signal from an input signal.

BACKGROUND

Mobile wireless communication devices such as cellular telephones, smartphones, personal digital assistants (PDAs), etc. can be configured to communicate with other devices over a multitude of different frequencies. As such, mobile wireless communication devices are required to include receivers capable of receiving communication signals at a multitude of different frequencies. In some situations, it is desirable to receive and demodulate two or more communication signals in different frequency bands using a technique referred to as multi-carrier aggregation. In this way, a larger bandwidth is available so that more information can be transmitted per second to provide a more pleasing user experience. To this end, receivers often include mixers for performing a frequency up-conversion or a frequency down-conversion of the received communication signals using a sinusoidal mixing signal with a desired frequency. Conventionally, such mixers include a PLL for every frequency band, which, however, drastically increases area and power consumption. A similar problem arises in frequency-division duplexing (FDD), where a mobile wireless communication device receives and transmits at the same time, but at different frequencies, so that at last two PLLs are necessary.

Thus, there is a need for an improved mixer.

SUMMARY

It is an object of the invention to provide an improved mixer.

This object is achieved by the subject matter of the independent claims. Further implementation forms are provided in the dependent claims, the description and the figures.

According to a first aspect the invention relates to a mixer for generating an analog output signal $X_{OUT}$ from an analog input signal $X_{IN}$ using a mixing signal having a mixing frequency $f_{MIX}$, the mixer comprising: a scaler being configured to sample the analog input signal $X_{IN}$ at a plurality of discrete points in time k with a sampling frequency $f_S$ to obtain a sampled analog input signal $X_{IN}[k]$ having a continuous signal value, and to generate the analog output signal $X_{OUT}$ having a continuous signal value by scaling the sampled analog input signal $X_{IN}[k]$ on the basis of a plurality of scaling coefficients $A[k]$, wherein the scaling coefficients $A[k]$ are a time-discrete representation of the mixing signal.

The mixer generates an analog output signal from an analog input signal by scaling, i.e. multiplying the time-sampled analog input signal with a plurality of scaling coefficients $A[k]$. The scaling coefficients $A[k]$ can be provided by the scaler on the basis of a control code n stored in the scaler. Thus, an improved mixer is provided.

According to a first implementation form of the first aspect of the invention, the sampling frequency $f_S$ is equal to or larger than twice the mixing frequency $f_{MIX}$ of the mixing signal.

In accordance with the sampling theorem, the sampling frequency $f_S$ is preferably at least twice as large as the mixing frequency $f_{MIX}$ such that the mixing signal can be represented without aliasing effects. This facilitates the use of the mixer.

According to a second implementation form of the first aspect of the invention as such or the first implementation form thereof, the mixing signal is a sinusoidal mixing signal.

The scaling coefficients $A[k]$ can be represented, for instance, by $$A[k]=\cos(2\pi f_{MIX} k T_S + \theta)$$

with $T_S=1/f_S$ being the sampling period and $\theta$ being an arbitrary phase angle.

According to a third implementation form of the first aspect of the invention as such or the first or second implementation form thereof, the ratio of the mixing frequency $f_{MIX}$ to the sampling frequency $f_S$ is given by A/B with A and B being integers.

For such a mixer the mixing signal will be periodical when sampled at $f_S$ so that it can be stored in a lookup table (LUT) or periodical shift register of finite size in a memory of the scaler.

According to an advantageous implementation form of the third implementation form of the first aspect of the invention, the integers A and B are chosen such that the quantity $$L = \frac{B}{\gcd(A, B)}$$

is an integer multiple of 4, wherein $\gcd(A, B)$ denotes the greatest common divisor of A and B.

According to a fourth implementation form of the first aspect of the invention as such or one of the first to third implementation form thereof, the scaler is configured to derive the sampling frequency $f_S$ from a local oscillator frequency $f_{LO}$ of a local oscillator signal provided by a local oscillator, wherein the sampling frequency $f_S$ is an integer multiple of the local oscillator frequency $f_{LO}$, in particular equal to four times the local oscillator frequency $f_{LO}$.

In such a mixer a local oscillator (LO) signal already available in a system including the mixer, e.g. in a system with a transmitter and a receiver, where the mixer is part of the receiver and the transmitter comprises a local oscillator providing a local oscillator signal, can be used for mixing with a mixing frequency $f_{MIX}$ that is different from $f_{LO}$.

According to a fifth implementation form of the first aspect of the invention as such or one of the first to fourth implementation form thereof, the analog input signal $X_{IN}$ is an analog voltage signal $V_{IN}$ or an analog current signal $I_{IN}$ and wherein the analog output signal $X_{OUT}$ is an analog voltage signal $V_{OUT}$ or an analog current signal $I_{OUT}$.

In the advantageous case of a current input signal anti-aliasing filtering is provided.

According to a sixth implementation form of the first aspect of the invention as such or one of the first to fifth implementation form thereof, the mixer comprises an input terminal and an output terminal and the scaler comprises a plurality of unit cells connected in parallel to the input terminal, wherein each unit cell comprises a unit cell capacitor, wherein the unit cell capacitor of the i-th unit cell has a capacitance $C_{ui}$ and wherein the sum of the capacitances of the unit cells defines a total capacitance $C_s$, and wherein each unit cell comprises a charge transfer switch for connecting the unit cell capacitor of each unit cell to the output terminal, wherein the scaler is configured to control the charge transfer switch of each unit cell for scaling the sampled analog input signal $X_{IN}[k]$ on the basis of the plurality of scaling coefficients $A[k]$.

This implementation form provides an efficient mixer using unit cells with unit capacitors that for a given k can contribute differently to the scaling coefficient $A[k]$.

According to a seventh implementation form of the sixth implementation form of the first aspect of the invention, the plurality of unit cells comprises N unit cells, wherein the unit cell capacitors have the same capacitance $C_{ui}=C_u$ with $C_u$ being a constant capacitance so that the total capacitance $C_s$ is given by $C_s=NC_u$.

This advantageous implementation form of a mixer with identical unit cells having identical capacitances provides optimal matching properties.

According to an eighth implementation form of the sixth implementation form of the first aspect of the invention, the plurality of unit cells comprises b unit cells, wherein the unit cell capacitor of the i-th unit cell has a capacitance $C_{ui}=2^{i-1}C_u$ with $C_u$ being a constant capacitance so that the total capacitance $C_s$ is given by $C_s=(2^b-1)C_u$, where i can range from 1 to b.

This advantageous implementation form of a mixer with unit cells increasing by factors of 2 is more compact in terms of layout and therefore results in better parasitics.

According to a ninth implementation form of the sixth implementation form of the first aspect of the invention, the plurality of unit cells comprises (b+K) unit cells, wherein the unit cell capacitor of the i-th unit cell of the b unit cells of the plurality of unit cells has a capacitance $C_{ui}=2^{i-1}C_u$, where i can range from 1 to b and $C_u$ is a constant capacitance, and wherein the unit cell capacitors of the K remaining unit cells of the plurality of unit cells have the same capacitance $C_{ui}=2^b C_u$ so that the total capacitance $C_s$ is given by $C_s=(2^b K+2^b-1)C_u$.

This advantageous implementation form of a mixer with a combination of binary and unary cells provides an optimal tradeoff between parasitics and matching properties.

According to a tenth implementation form of one of sixth to ninth implementation form of the first aspect of the invention, the input terminal comprises a positive input terminal and a negative input terminal, wherein the output terminal comprises a positive output terminal and a negative output terminal in order to operate the mixer differentially and wherein each unit cell of the plurality of unit cells comprises a plurality of inversion switches, wherein the scaler is configured to control the plurality of inversion switches such that each side of the unit cell capacitor of a unit cell of the plurality of unit cells can be connected to the positive output terminal and/or the negative output terminal.

This advantageous differential implementation of a mixer allows realizing negative scaling coefficients $A[k]$.

According to an eleventh implementation form of one of sixth to tenth implementation form of the first aspect of the invention, the scaler comprises a memory, the memory being configured to store a plurality of control codes n, wherein each control code n determines the fraction $\alpha[k]$ of the total capacitance $C_s$ that is connected to the output terminal of the mixer.

In such a mixer the control code n can determine the fraction of the total capacitance $C_s$ contributing to the scaling factor $A[k]$.

According to a twelfth implementation form of one of the sixth to eleventh implementation form of the first aspect of the invention, the scaler comprises $2^M$ blocks of unit cells, wherein M is an integer and wherein each block of unit cells is configured to sample the sampled analog input signal $X_{IN}[k]$ with a different phase, and wherein each block uses a possibly different set of scaling factors $A[k]$.

This implementation form is advantageous with respect to current transistor technologies by using, for instance, a 4-phase mixer with four blocks of unit cells. In this way the required sampling rate in each of the blocks is only $f_s/2^M$, which allows for a higher combined sampling rate $f_s$.

According to a thirteenth implementation form of one of the sixth to twelfth implementation form of the first aspect of the invention, each unit cell of the scaler further comprises a reset switch for discharging the unit cell capacitor, wherein the scaler is configured to open and close the reset switch of each unit cell.

According to a fourteenth implementation form of one of the sixth to thirteenth implementation form of the first aspect of the invention, the scaler is configured to control an input control switch of each unit cell for sampling the analog input signal $X_{IN}$ by means of a first clock signal $\varphi_0$.

According to a fifteenth implementation form of one of the sixth to fourteenth implementation form of the first aspect of the invention, the scaler further comprises a transfer capacitor with a capacitance $C_t$, wherein the transfer capacitor is connected to the connection between the charge transfer switch of each unit cell and the output terminal of the mixer.

According to a sixteenth implementation form of one of the sixth to fifteenth implementation form of the first aspect of the invention, each unit cell of the scaler further comprises a dummy capacitor with a capacitance $C_{ui}$, wherein the dummy capacitor of each unit cell is connected to the connection between the charge transfer switch of each unit cell and the output terminal of the mixer via a dummy control switch, wherein the scaler is configured to close the charge transfer switches and to open the dummy control switches of a fraction of the plurality of unit cells and to open the charge transfer switches and to close the dummy control switches of the remaining unit cells of the plurality of unit cells on the basis of the control codes n stored in the memory of the scaler.

According to a second aspect the invention relates to a method for generating an analog output signal $X_{OUT}$ from an analog input signal $X_{IN}$ using a mixing signal having a mixing frequency $f_{MIX}$, the method comprising the steps of: sampling the analog input signal $X_{IN}$ at a plurality of discrete points in time k with a sampling frequency $f_S$ to obtain a sampled analog input signal $X_{IN}[k]$ having a continuous signal value; and generating the analog output signal $X_{OUT}$ having a continuous signal value by scaling the sampled analog input signal $X_{IN}[k]$ on the basis of a plurality of scaling coefficients $A[k]$, wherein the scaling coefficients $A[k]$ are a time-discrete representation of the periodic mixing signal.

The method according to the second aspect of the invention can be performed by the mixer according to the first aspect of the invention. Further features of the method according to the second aspect of the invention result directly from the functionality of the mixer according to the first aspect of the invention.

According to a third aspect the invention relates to a computer program comprising a program code for performing the method according to the second aspect of the invention when executed on a computer.

The invention can be implemented in hardware and/or software.

BRIEF DESCRIPTION OF THE DRAWINGS

Embodiments of the invention will be described with respect to the following figures, in which:

FIGS. 10a to 10d show schematic diagrams illustrating the operational principle of a mixer according to an embodiment;

FIGS. 11a to 11c show schematic diagrams illustrating the operational principle of a mixer according to an embodiment;

DETAILED DESCRIPTION OF EMBODIMENTS

In the following detailed description, reference is made to the accompanying drawings, which form a part of the disclosure, and in which are shown, by way of illustration, specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
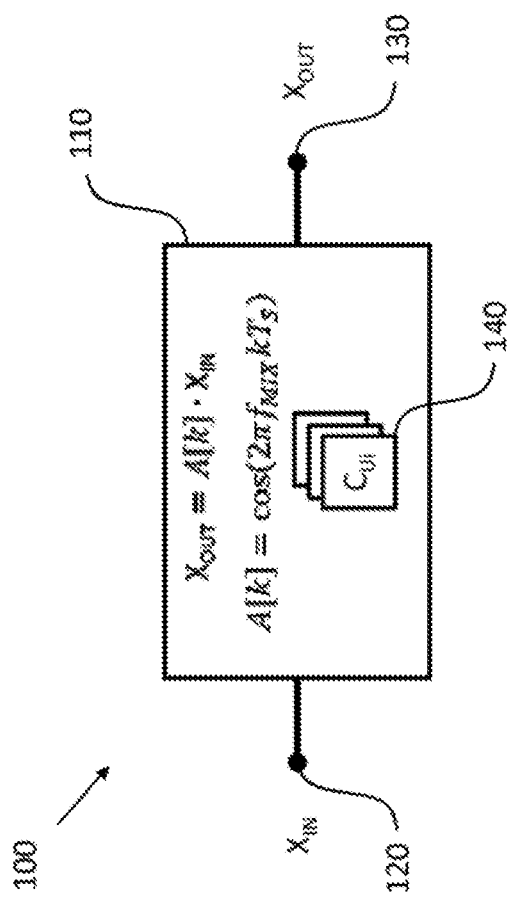
FIG. 1 shows a schematic diagram of a mixer for generating an analog output signal from an analog input signal using a mixing signal having a mixing frequency $f_{MIX}$ according to an embodiment.

FIG. 1 shows a schematic diagram of a mixer 100 for generating an analog output signal $X_{OUT}$ from an analog input signal $X_{IN}$ using a mixing signal having an adjustable mixing frequency $f_{MIX}$ according to an embodiment. The mixer 100 comprises a scaler 110 being configured to sample the analog input signal $X_{IN}$ at a plurality of discrete points in time k with a sampling frequency $f_S$ at an input terminal 120 of the mixer 100 to obtain a sampled analog input signal $X_{IN}[k]$ having a continuous signal value, and to generate the analog output signal $X_{OUT}$ at an output terminal 130 of the mixer 100 having a continuous signal value by scaling the sampled analog input signal $X_{IN}[k]$ on the basis of a plurality of scaling coefficients A[k], i.e. $X_{OUT}=A[k]\cdot X_{IN}[k]$. The scaling coefficients A[k] are a time-discrete representation of the mixing signal.

In an embodiment, the mixing signal used by the mixer 100 is a sinusoidal mixing signal with the scaling coefficients A[k] given, for instance, by $$A[k]=\cos(2\pi f_{MIX}kT_S+\theta)$$

with $T_S=1/f_S$ being the sampling period and $\Theta$ being an arbitrary phase angle.

In an embodiment, the scaler 110 comprises a plurality of unit cells 140 connected in parallel to the input terminal 120. Each unit cell 140 comprises a unit cell capacitor $C_{ui}$, wherein the unit cell capacitor of the i-th unit cell has a capacitance $C_{ui}$ and wherein the sum of the capacitances of the unit cells defines a total capacitance $C_s$. Each unit cell 140 comprises a charge transfer switch for connecting the unit cell capacitor $C_{ui}$ of each unit cell 140 to the output terminal 130. The scaler 110 is configured to control the charge transfer switch of each unit cell 140 for scaling the sampled analog input signal $X_{IN}[k]$ on the basis of the plurality of scaling coefficients A[k].

In an embodiment, the plurality of unit cells 140 comprises N unit cells, wherein the unit cell capacitors $C_{ui}$ have the same capacitance $C_{ui}=C_u$ with $C_u$ being a constant capacitance and the total capacitance $C_s$ is given by $C_s=NC_u$.

In an embodiment, the plurality of unit cells 140 comprises b unit cells, wherein the unit cell capacitor of the i-th unit cell has a capacitance $C_{ui}=2^{i-1}C_u$ with $C_u$ being a constant capacitance and the total capacitance $C_s$ is given by $C_s=(2^b-1)C_u$, where i can range from 1 to b.

In an embodiment, the plurality of unit cells 140 comprises (b+K) unit cells, wherein the unit cell capacitor of the i-th unit cell of the b unit cells of the plurality of unit cells 140 has a capacitance $C_{ui}=2^{i-1}C_u$, where i can range from 1 to b and $C_u$ is a constant capacitance, and wherein the unit cell capacitors of the K remaining unit cells of the plurality of unit cells 140 have the same capacitance $C_{ui}=2^bC_u$ and the total capacitance $C_s$ is given by $C_s=(2^bK+2^b-1)C_u$.

Figure 2:
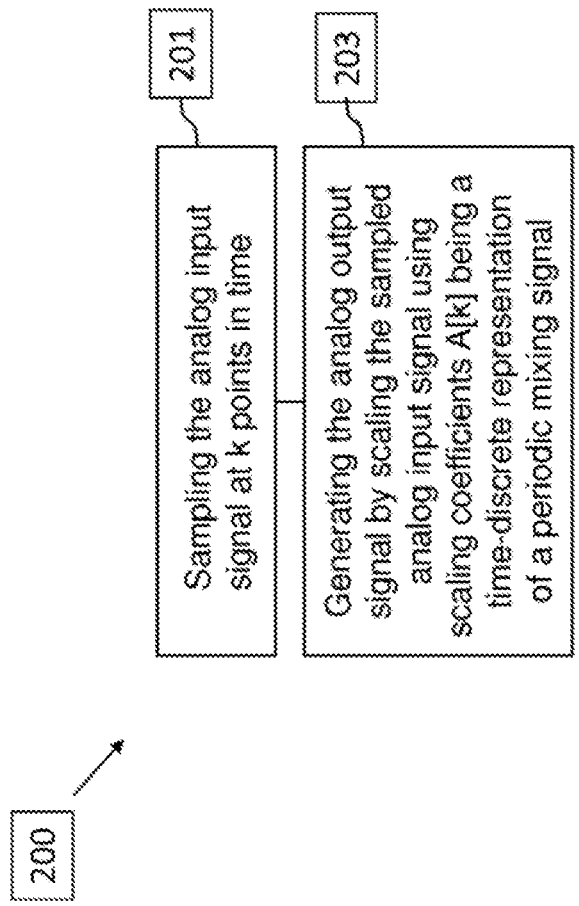
FIG. 2 shows a schematic diagram of a method for generating an analog output signal from an analog input signal using a mixing signal having a mixing frequency $f_{MIX}$ according to an embodiment.

FIG. 2 shows a schematic diagram of a method 200 for generating an analog output signal $X_{OUT}$ from an analog input signal $X_{IN}$ using a mixing signal having a mixing frequency $f_{MIX}$ according to an embodiment. The method 200 comprises a step 201 of sampling the analog input signal $X_{IN}$ at a plurality of discrete points in time k with a sampling frequency $f_S$ to obtain a sampled analog input signal $X_{IN}[k]$ having a continuous signal value, and a step 203 of generating the analog output signal $X_{OUT}$ having a continuous signal value by scaling the sampled analog input signal $X_{IN}[k]$ on the basis of a plurality of scaling coefficients A[k]. The scaling coefficients A[k] are a time-discrete representation of the periodic mixing signal.

In the following, further implementation forms and embodiments of the mixer 100 and the method 200 are described.

Figure 3:
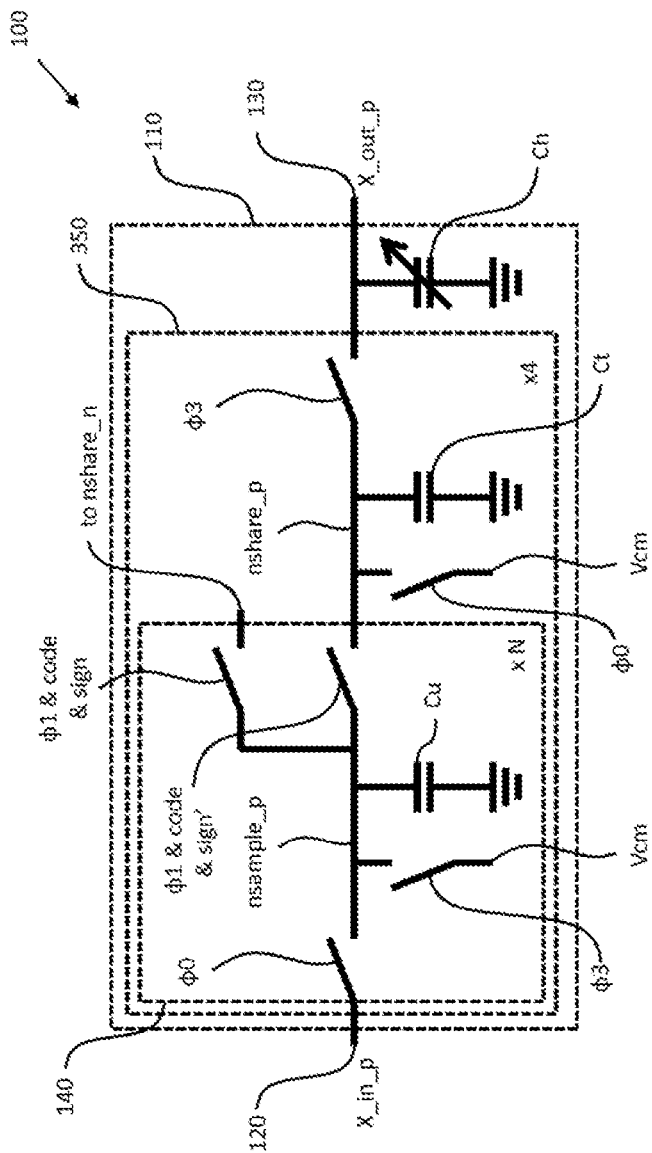
FIG. 3 shows a schematic diagram of a mixer for generating an analog output signal from an analog input signal using a mixing signal having a mixing frequency $f_{MIX}$ according to an embodiment.

FIG. 3 shows a schematic diagram of a mixer 100 for generating an analog output signal $X_{OUT}$ from an analog input signal $X_{IN}$ using a mixing signal having an adjustable mixing frequency $f_{MIX}$ according to an embodiment. In the embodiment of FIG. 3 the mixer 100 is implemented differentially and for the sake of simplicity only one half of the differential mixer 100 is shown in FIG. 3 acting on the positive input signal $X_{IN,p}$ of the analog input signal $X_{IN}$ and generating the positive output signal $X_{OUT,p}$ of the analog output signal $X_{OUT}$. The mixer 100 comprises a scaler 110 being configured to sample the analog input signal at a plurality of discrete points in time k with a sampling frequency $f_S$ at an input terminal 120 of the mixer 100 to obtain a sampled analog input signal having a continuous signal value, and to generate the analog output signal at an output terminal 130 of the mixer 100 having a continuous signal value by scaling the sampled analog input signal on the basis of a plurality of scaling coefficients A[k], i.e. $X_{OUT}=A[k]\cdot X_{IN}[k]$. The scaling coefficients A[k] are a time-discrete representation of the mixing signal.

In an embodiment, the mixer 100 shown in FIG. 3 is configured to operate by using four clock signals $\varphi_0$ to $\varphi_3$. By means of these clock signals different switches of the mixer 100 can be controlled, which will be described in more detail further below. In an embodiment, the clock signals $\varphi_0$ to $\varphi_3$ have a frequency corresponding to a frequency $f_{LO}$ of a local oscillator (LO) and are 90 degrees out of phase with duty cycles of 25%. In an embodiment, the clock signals $\varphi_0$ to $\varphi_3$ have the form as sketched in FIG. 4.

Referring back to the mixer embodiment shown in FIG. 3, the scaler 110 comprises four blocks 350 of N unit cells 140. Each unit cell 140 comprises a unit cell capacitor G having a capacitance $C_u$. The sum of the capacitances $C_u$ of the unit cell capacitors $C_u$ of the N unit cells 140 defines a total or sum capacitance $C_s$ with $C_s=N\cdot C_u$.

Each unit cell 140 further comprises an input control switch that is referenced in FIG. 3 by "$\varphi_0$" to indicate that the input control switch of each unit cell 140 is controlled by the clock signal $\varphi_0$. When the clock signal $\varphi_0$ is high, the input control switch of each unit cell 140 connects the unit cell capacitors $C_u$ and the node "nsample_p" of all unit cells 140 with the input terminal 120 being supplied with the analog input signal $X_{IN,p}$ so that all unit cells 140 sample the analog input signal $X_{IN,p}$ with the result that all unit cell capacitors $C_u$ are charged to the same voltage $V_{IN}$ at the end of the high phase of $\varphi_0$ with $V_{IN}$ being the voltage at the input terminal 120 (relative to ground). At this point, the total charge on all unit cell capacitors $C_u$ together is given by $Q_s=C_s\cdot V_{IN}$.

When the clock signal $\varphi_1$ is high, a fraction of the total number of N unit capacitors $C_u$ is connected to a transfer capacitor $C_t$ via a charge transfer switch that is connected to the node "nshare_p" and referenced in FIG. 3 by "$\varphi_1$ & control & sign" to indicate that the charge transfer switch of each unit cell 140 is controlled by the clock signal $\varphi_1$, by a digital control code n and the inverse of the sign bit, wherein "&" denoted a logical AND operation. In the mixer embodiment shown in FIG. 3 the sign bit is assumed to be 0 for positive and 1 for negative numbers.

In an embodiment, the digital control code n determines how many of the N unit cells 140 are connected to the transfer capacitor $C_t$ while the clock signal $\varphi_1$ is high. During this phase, a fraction $\alpha=n/N$ of the total charge $Q_s$ is redistributed over a total capacitance $C_t+n\cdot C_u=C_t+\alpha\cdot C_s$. This results in a voltage $$V_t = \frac{\alpha C_s}{\alpha C_s + C_t} \cdot V_{IN} \quad (1)$$

on the transfer capacitor $C_t$ (as well as on all the unit cells 140 connected to the transfer capacitor $C_t$).

The mixer 100 shown in FIG. 3 is configured to change the control code n for every time step, i.e. for every sampled value of $V_{IN}$. In other words, the control code n is a function of the discrete time variable k, i.e. n[k]. By using different digital control codes n for different time steps the mixer 100 shown in FIG. 3 is configured to provide a scaling coefficient (or voltage gain)

$$A[k] = \frac{\alpha[k]C_s}{\alpha[k]C_s + C_t} \quad (2)$$

Since the mixer 100 shown in FIG. 3 can be implemented differentially, a negative voltage gain can easily be achieved by connecting the unit cell capacitors $C_u$ on the positive side of the mixer 100 to the transfer capacitor $C_t$ on the negative side of the mixer 100 and vice versa. To this end, each unit cell 140 of the mixer 100 can comprise an additional switch that is connected to the node "nshare_n" and referenced in FIG. 3 by "$\varphi_1$ & control & sign" to indicate that the additional switch of each unit cell 140 is controlled by the clock signal $\varphi_1$, by the digital control code n and the sign bit.

In an embodiment, it is possible that the mixer 100 shown in FIG. 3 remains idle during the high phase of the clock signal $\varphi_2$, because essentially only three different clock signal phases are necessary for the mixer 100 shown in FIG. 3. This embodiment can be advantageous when the clock signal $\varphi_1$ may be delayed somewhat by the required gating on the clock signals, which could cause an overlap of the clock signal $\varphi_1$ with the clock signal $\varphi_2$.

During the high phase of the clock signal $\varphi_3$ the voltage in all unit cells 140 is reset to the common-mode DC voltage $V_{CM}$ of the input and output signals via a reset switch, which in the embodiment shown in FIG. 3 is part of each unit cell 140 and referenced in FIG. 3 by "$\varphi_3$" to indicate that the reset switch of each unit cell 140 is controlled by the clock signal $\varphi_3$. While having a reset switch is not necessary in case of an ideal voltage input signal, it is advantageous for a current input signal, as will be described in more detail further below. Moreover, if the mixer 100 shown in FIG. 3 is driven by a voltage input signal with nonzero output impedance, a memory effect could be caused by the fact that some unit cells 140 still hold the full charge from the previous sample while others have already transferred a portion of their charge to the transfer capacitor $C_t$.

As the person skilled in the art will appreciate, the parts of the mixer 100 described so far can process one sample of the input signal per LO cycle. In an embodiment, in order to achieve an effective sampling frequency $f_S$ of four times the LO frequency $f_{LO}$, i.e. $f_S = 4f_{LO}$, the mixer 100 shown in FIG. 3 (or rather the scaler 110 of the mixer 100) comprises four blocks 350 of unit cells 140, wherein each block 350 comprises a transfer capacitor $C_t$ and is configured to sample the input signal $X_{IN, p}$ during a different phase of the clock signals $\varphi_0$ to $\varphi_3$. In other words, each block 350 of unit cells 140 operates 90 degrees out of phase at the LO frequency $f_{LO}$ providing for an effective sampling rate $f_S$ of $4f_{LO}$.

In order to recombine the samples of the input signal $X_{IN, p}$ taken by the four blocks 350 of the mixer 100 shown in FIG. 3 back into a single analog signal, a single hold capacitor $C_h$ is provided at the output terminal 130. The hold capacitor $C_h$ is connected via four hold capacitor switches to all four blocks 350 of the mixer 100 and hence redistributes charge with one of the phases during each clock signal phase. The hold capacitor switch of a block 350 is referenced in FIG. 3 by "$\varphi_3$" to indicate that the hold capacitor switch of each block 350 is controlled by the clock signal $\varphi_3$. The person skilled in the art will appreciate that, because of this, there is no clock signal phase during which the hold capacitor $C_h$ can be reset.

It can be shown that the four transfer capacitors $C_t$ of the four blocks 350 together with the hold capacitor $C_h$ implement an infinite impulse response (IIR) lowpass filter whose transfer function is given by $$H_{IIR}(z) = \frac{1}{1 - z^{-1}\frac{C_h}{C_t + C_h}} \quad (3)$$

where the z-transform has to be taken at a sampling rate $f_S = 4f_{LO}$. The pole of this filter is located at $$f_p = \frac{4f_{lo}}{2\pi} \cdot \ln\left(1 + \frac{C_t}{C_h}\right) \quad (4)$$

In an embodiment, where the mixer 100 is implemented as a component of a receiver, the IIR lowpass filter can be used as a first filtering stage in the receiver lineup. In an embodiment, the hold capacitor $C_h$ can be provided by a tunable capacitor, as indicated in FIG. 3, to tune the filter pole depending on the communication band one wishes to receive.

In the embodiment shown in FIG. 3, each of the four blocks 350 of the mixer 100 uses a control code n to scale the input signal $X_{IN, p}$ sampled at an effective sampling rate $f_S = 4f_{LO}$. As each block 350 scales only every fourth sample of the input signal, the control code n has to be present within a block with frequency $f_{LO}$. When considered together as one signal sampled at $f_S = 4f_{LO}$, the control codes n of the four blocks 350 provide the mixing signal with the frequency $f_{MIX}$. If the ratio $f_{MIX}/f_S$ is some rational number A/B, only a finite set of control code samples is needed which can be repeated forever, as will be described in more detail further below. For cellular bands, the number of required control code samples is usually below 30, so the samples can easily be stored in a local lookup table (LUT) or shift register of the mixer 100.

Figure 5:
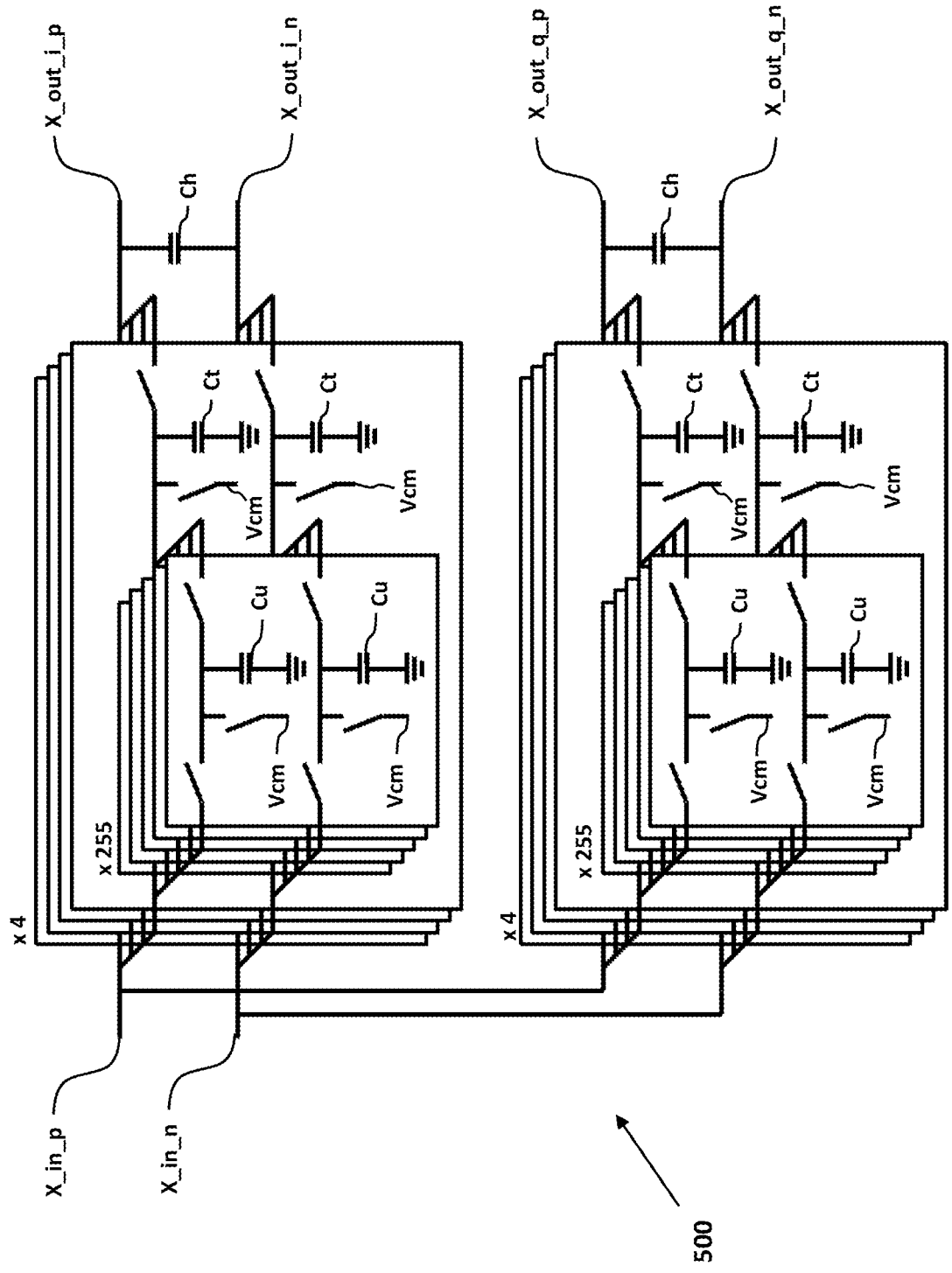
FIG. 5 shows a schematic diagram of a quadrature mixer for generating an analog output signal from an analog input signal using a mixing signal having a mixing frequency $f_{MIX}$ according to an embodiment.

FIG. 5 shows a schematic diagram of a mixer 500 for generating an analog output signal from an analog input signal using a mixing signal having an adjustable mixing frequency $f_{MIX}$ according to an embodiment. In the embodiment of FIG. 5 the mixer 500 is implemented in form of a quadrature mixer by connecting two of the above described mixers 100 in parallel. Each mixer 100 of the quadrature mixer 500 is controlled by a different set of control codes n, which define respective mixing signals that are 90 degrees out of phase.

Figure 4:
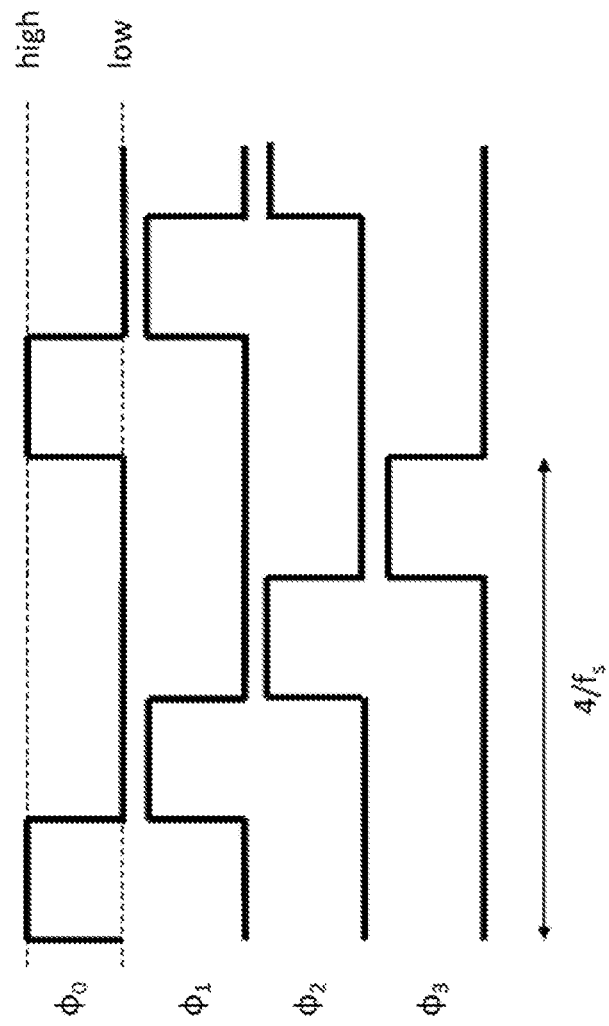
FIG. 4 shows a schematic diagram of a plurality of clock signals for driving a mixer for generating an analog output signal from an analog input signal using a mixing signal having a mixing frequency $f_{MIX}$ according to an embodiment.

As FIG. 5 and the following figures contain several elements that already have been described in detail in the context of FIGS. 1 and 4, these elements generally will be described in the below only in the case that their meaning cannot be easily derived from the above detailed description of the embodiments of FIGS. 1 and 4, in order to avoid unnecessary repetitions.

The embodiments of the mixer 100 shown in FIGS. 3 and 5 provide a unary mixer implementation, i.e. a mixer 100 having at least one block 350 of identical unit cells 140 with identical capacitances $C_u$. This solution involves relatively little layout work and is best suited for matching between the unit cells 140.

As already mentioned above, the mixer 100 can be provided in form of a binary mixer implementation, wherein binary implementation means that the capacitance $C_{ui}$ of the unit cell capacitor of the i-th unit cell 140 has a capacitance $C_{ui}=2^{i-1}C_u$ with $C_u$ being a constant capacitance. In case of a binary implementation of the mixer 100 the total capacitance $C_s$ is given by $C_s=(2^b-1)C_u$, where b is the total number of binary unit cells 140.

By employing a binary implementation of the mixer the most significant bits (MSBs) can be implemented with much less area and parasitics, which can improve power consumption and input capacitance at the expense of degraded matching properties.

As already mentioned above, the mixer 100 can be implemented as a combination of a unary and a binary implementation having (b+K) unit cells 140, wherein the unit cell capacitor of the i-th unit cell of the b unit cells of the (b+K) unit cells has a capacitance $C_{ui}=2^{i-1}C_u$ with $C_u$ being a constant capacitance, and wherein the unit cell capacitors of the K remaining unit cells of the (b+K) unit cells have the same capacitance $C_{ui}=2^b C_u$ and the total capacitance $C_s$ is given by $C_s=(2^b K+2^b-1)C_u$. This combination of binary and unary unit cells provides an optimal tradeoff between parasitics and matching properties.

In an embodiment, the mixer 100 is configured to process an analog voltage signal $V_{IN}$ or an analog current signal $I_{IN}$ as the analog input signal $X_{IN}$ or an analog voltage signal $V_{OUT}$ or an analog current signal $I_{OUT}$ as the analog output signal $X_{OUT}$.

In an embodiment where the analog input signal $X_{IN}$ is an analog voltage signal $V_{IN}$, the total capacitance $C_s$ of the mixer embodiment 100 shown in FIGS. 3 and 5 will be charged until the voltage over it is equal to the analog voltage signal $V_{IN}$ and, thus, the mixer embodiment 100 shown in FIGS. 3 and 5 will sample the input signal. In this case the mixer embodiment 100 shown in FIGS. 3 and 5 is sensitive to variations of the time at which the input control switch controlled by clock signal $\varphi_0$ is opened, since this determines when the input signal is sampled. In addition, the resistance of the input control switch (when conducting) of a unit cell 140 of the mixer embodiment shown in FIG. 3 should be low enough to allow good settling, i.e. to allow $C_s$ to be charged to the correct voltage during the time the input control switch is closed.

In an embodiment where the analog input signal $X_{IN}$ is an analog current signal IN, the current will be integrated on $C_s$ during the time the input control switch is closed. When the input control switch is opened by the clock signal $\varphi_0$ going from "high" to "low", the voltage on $C_s$ will represent the integral of the analog current signal $I_{IN}$ over this period. By means of such an embodiment, an integrate-and-dump low-pass filter is realized, which provides some advantageous anti-aliasing filtering. In this case the mixer embodiment 100 shown in FIGS. 3 and 5 is sensitive to variations of both the time the input control switch is closed and the time it is opened, because the difference between these times determines the period over which the input signal is integrated and the times also determine when exactly the input signal is sampled.

Each of the capacitors $C_s$, $C_t$ and/or $C_h$ can be implemented either as a single-ended capacitor or a differential capacitor with half the capacitance of the single-ended capacitor. Using differential capacitors has the following advantages. A differential capacitor can replace two single-ended capacitors, so that four times less chip area is used. Implementing the capacitors $C_s$ or $C_t$ as differential capacitors results in a strong common-mode rejection. Common-mode signals can only be passed by being sampled on the parasitic capacitance to the substrate or to other nets. Using single-ended capacitors has the following advantages. Since for single-ended capacitors four times more physical capacitance is used, the standard deviation on the effective differential capacitance will be two times lower. Implementing the hold capacitor $C_h$ as a single-ended capacitor has the effect that the IIR filter will also filter out high-frequency common-mode signals.

In the embodiment shown in FIG. 5, the hold capacitor $C_h$ is implemented differentially to save area. The total capacitance $C_s$ or rather the unit capacitors $C_u$ of the unit cells 140 are implemented as single-ended capacitors in order to have better matching between the unit cells. The area impact of this is usually less large since the area of the unit cells 140 is not only determined by the unit cell capacitors $C_u$ but also by the switches of a unit cell 140 and by routing overhead.

As can be seen from above equation (2), for the mixer embodiments shown in FIGS. 3 and 5 the maximum value of the scaling coefficient or voltage gain A[k] is achieved when $\alpha=1$ and is given by $$A_{max} = \frac{C_s}{C_s + C_t} \quad (5)$$

The choice of the size of the capacitance of the transfer capacitor $C_t$ relative to the total capacitance $C_s$ is a trade-off between quantization noise and voltage loss. This can be seen as follows.

If $C_t$ tends towards infinity, the term $\alpha \cdot C_s$ in the denominator of equation (2) becomes negligible and the scaling coefficient A[k] converges to $$A[k] \to \frac{\alpha C_s}{C_t} (C_T \to \infty) \quad (6)$$

This means that the scaling coefficient A[k] becomes directly proportional to $\alpha$. This is beneficial, because the quantization levels for $\alpha$ are spaced equidistantly, so this will also hold for the scaling coefficient A[k]. However, as $C_t$ increases towards infinity, the maximum value of the scaling coefficient $A_{max}$ will go to zero.

As $C_t$ becomes smaller, the term $\alpha \cdot C_s$ in the denominator becomes more dominant and $A_{max}$ will increase. Simultaneously, the dependence of the scaling coefficient A[k] on $\alpha$ becomes gradually more nonlinear, so that there will be more quantization levels close to 1 and fewer close to 0. Most likely this leads to an increase of the quantization noise.

If $C_t$ decreases towards zero, it becomes negligible in the denominator so that $$A[k] \to 1 (C_t \to 0) \quad (7)$$

This is the largest scaling coefficient one can achieve with a passive structure, but it is now independent of $\alpha$. This means that all quantization levels for A[k] coincide and no more mixing can be achieved.

The optimum values for $C_s$ and $C_t$ depend on the given circumstances of an application, in which the mixer 100 is to be employed, such as noise, quantization noise, voltage gain as well as area and power consumption. In an embodiment, the capacitances $C_s$ and $C_t$ are comparable in size. In the case $C_s=C_t$, the dependence of A[k] on $\alpha$ is not so far from a straight line, and $A_{max}$ is equal to 0.5.

Figure 6:
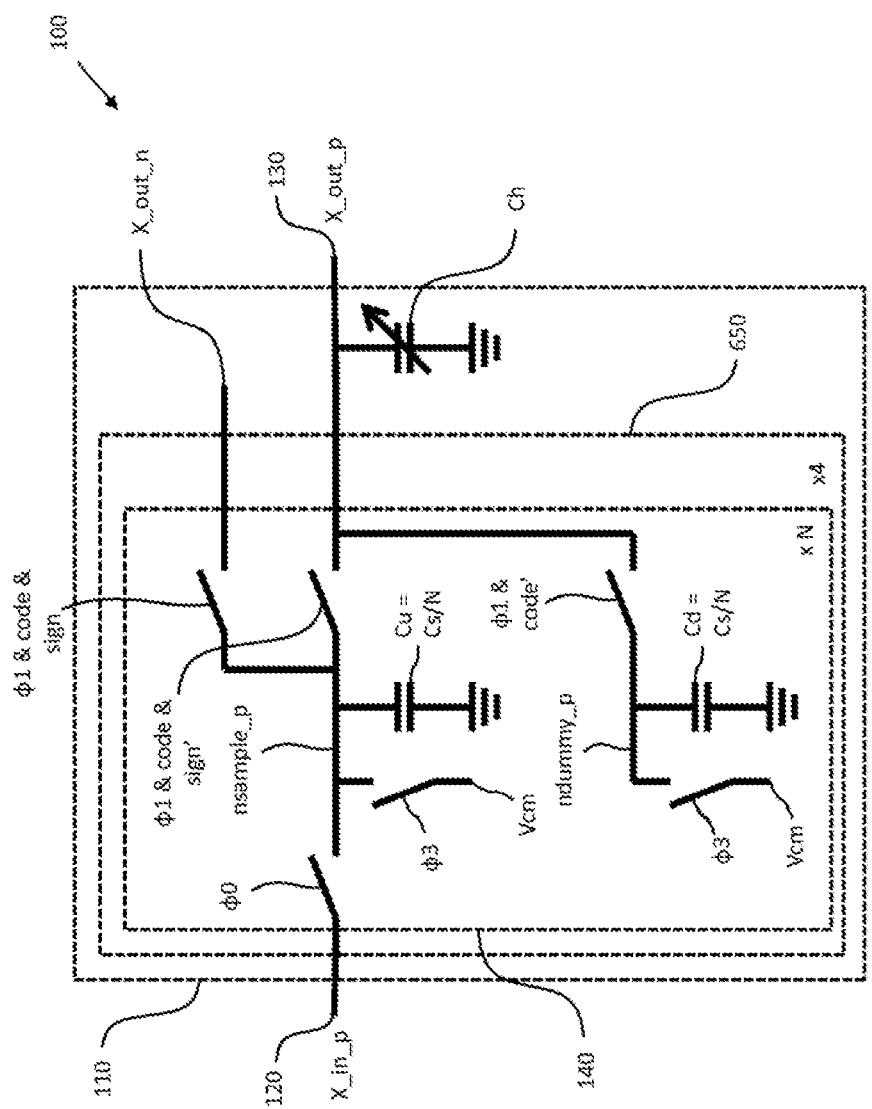
FIG. 6 shows a schematic diagram of a mixer for generating an analog output signal from an analog input signal using a mixing signal having a mixing frequency $f_{MIX}$ according to an embodiment.

FIG. 6 shows a schematic diagram of a mixer 100 for generating an analog output signal $X_{OUT}$ from an analog input signal $X_{IN}$ using a mixing signal having an adjustable mixing frequency $f_{MIX}$ according to an embodiment. In the embodiment of FIG. 6 the mixer 100 is implemented differentially and for the sake of simplicity only one half of the differential mixer 100 is shown in FIG. 6 acting on the positive input signal $X_{IN,p}$ of the analog input signal $X_{IN}$ and generating the positive output signal $X_{OUT,p}$ of the analog output signal $X_{OUT}$. The mixer 100 comprises a scaler 110 being configured to sample the analog input signal at a plurality of discrete points in time k with a sampling frequency $f_S$ at an input terminal 120 of the mixer 100 to obtain a sampled analog input signal having a continuous signal value, and to generate the analog output signal at an output terminal 130 of the mixer 100 having a continuous signal value by scaling the sampled analog input signal on the basis of a plurality of scaling coefficients A[k], i.e. $X_{OUT}$=A[k]·$X_{IN}$[k]. The scaling coefficients A[k] are a time-discrete representation of the mixing signal.

Generally, the main differences between the mixer embodiment shown in FIG. 6 and the mixer embodiment shown in FIG. 3 are that the transfer capacitor $C_t$ has been removed in the mixer embodiment shown in FIG. 6 and that the unit cells 140 of the scaler 110 of the mixer 100 shown in FIG. 6 comprise a dummy unit capacitor $C_d$ in addition to the unit capacitor $C_u$, as will be described in more detail further below. In an embodiment, the capacitance of the dummy unit capacitor $C_d$ is essentially equal to the capacitance of the unit cell capacitor $C_u$, i.e. $C_d=C_u$.

Figure 7:
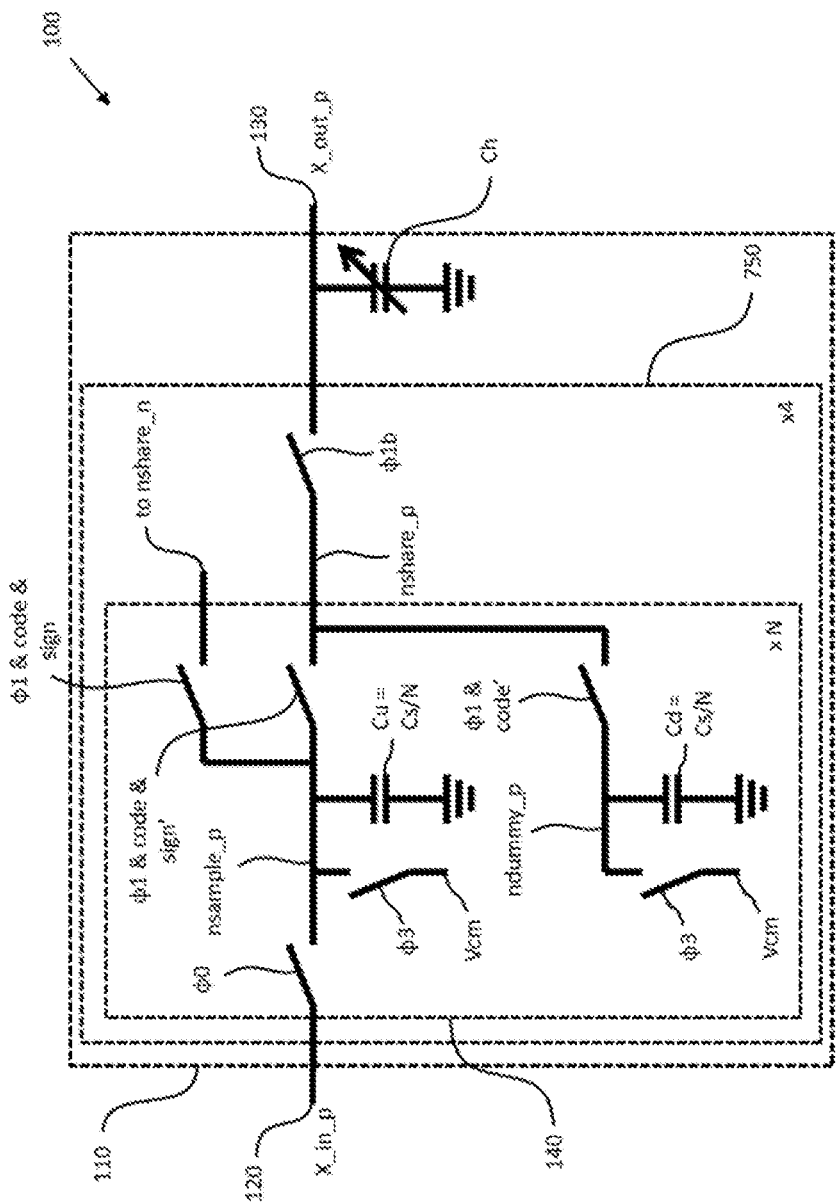
FIG. 7 shows a schematic diagram of a mixer for generating an analog output signal from an analog input signal using a mixing signal having a mixing frequency $f_{MIX}$ according to an embodiment.

For describing the operation of the mixer embodiment 100 shown in FIG. 6 it will be helpful to first describe the slightly modified embodiment of the mixer 100 shown in FIG. 7. The mixer embodiment shown in FIG. 7 differs from the mixer embodiment shown in FIG. 6 in that the mixer embodiment shown in FIG. 7 comprises an additional output switch at the output of each block 750 of the scaler 110. The additional output switch at the output of each block 750 of the scaler 110 is referenced in FIG. 7 by "$\varphi_{1b}$" to indicate that the additional output switch of each block 750 of the scaler 110 is controlled by a further clock signal $\varphi_{1b}$. In an embodiment, the clock signal $\varphi_{1b}$ makes the transition from "low" to "high" at a later point in time than the clock signal $\varphi_1$ but returns back to "low" at the same point in time as the clock signal $\varphi_1$. For instance, the "high" phase of the clock signal $\varphi_{1b}$ can be half as long as the "high" phase of the clock signal $\varphi_1$.

During the "high" phase of the clock signal $\varphi_0$, all unit cells 140 of the mixer embodiment 100 shown in FIG. 7 sample the analog input signal $X_{IN,p}$ on their unit capacitor $C_u$, leading to a voltage $V_{IN}$ on each $C_u$ and a total charge $Q_s=C_s·V_{IN}$ on $C_s$. The dummy capacitors $C_d$ have no charge, because they have been reset during the previous "high" phase of the clock signal $\varphi_3$ via the reset switch that is referenced in FIG. 7 by "$\varphi_3$" and connected with a respective dummy capacitor $C_d$.

During the "high" phase of the clock signal $\varphi_1$, only n (where n is defined by the digital control code) of the N unit cells 140 connect their unit capacitor $C_u$ to the node referred to as "nshare_p" in FIG. 7 (or the node referred as "nshare_n" in FIG. 7, if the sign is negative) via respective switches controlled by the clock signal $\varphi_1$, the digital control code n and the inverse of the sign bit. The remaining (N−n) unit cells 140 connect their "ndummy_p" node to the "nshare_p" node. Thus, a charge α·$Q_s$ (where α=n/N as before) is now redistributed over a total capacitance n·$C_u$+ (N−n)·$C_d=C_s$. This results in a voltage $$V_T = \frac{\alpha Q_s}{C_s} = \alpha V_{IN} \qquad (8)$$

and hence a scaling factor A[k] (or voltage gain)

$$A[k]=\alpha \qquad (9)$$

which is directly proportional to α. It is clear that for the embodiments shown in FIGS. 6 and 7 the maximum value $A_{max}$ of the scaling coefficient is now equal to 1, while the dependence of A[k] on α is always linear.

When the charge has been redistributed, the clock signal $\varphi_{1b}$ goes up and the additional output switch at the output of each block 750 of the scaler 110 referenced in FIG. 7 by "$\varphi_{1b}$," connects the "nshare_p" node to the output terminal 130, while the switches controlled by the clock signal $\varphi_1$ are still closed. In this way, the total capacitance $C_s$ carrying a charge α·$Q_s$ is connected to the hold capacitor $C_h$, which carries a charge depending on previous samples from the other blocks 750. During the "high" phase of the clock signal $\varphi_3$, the unit capacitors $C_u$ and the dummy unit capacitors $C_d$ are reset.

Just as in the case of the mixer embodiment 100 shown in FIG. 3, the above described configuration provides an IIR lowpass filter with a DC gain of 1, where $C_t$ has now been replaced by $C_s$ in the transfer function:

$$H_{IIR}(z) = \frac{1}{1 - z^{-1}\frac{C_h}{C_s + C_h}} \qquad (10)$$

The pole is located at $$f_p = \frac{4f_{lo}}{2\pi} \cdot \ln\left(1 + \frac{C_s}{C_h}\right) \qquad (11)$$

Since the sum of all the unit capacitors $C_u$ and the dummy unit capacitors $C_d$ connected to the hold capacitor $C_h$ is always equal to $C_s$, the pole frequency does not depend on α. The input capacitance of the mixer 100 is also always equal to $C_s$ and, thus, independent of α. This is beneficial for avoiding nonlinearities, in case the driving signal source has a nonzero output impedance.

Referring back to the mixer embodiment 100 shown in FIG. 6, it can be easily seen that the operation of the mixer embodiment 100 shown in FIG. 7 does not change, if the clocks $\varphi_1$ and $\varphi_{1b}$ go up at the same time. This is because the charge present on the n unit capacitors $C_u$ and on the hold capacitor $C_h$ is redistributed over a capacitance n·$C_u$+(N−n) ·$C_d$+$C_h$=$C_s$+$C_h$. For identical clock signals $\varphi_1$ and $\varphi_{1b}$ the additional output switch at the output of each block 750 of the scaler 110 referenced in FIG. 7 by "$\varphi_{1b}$" can be removed. This leads to the mixer embodiment 100 shown in FIG. 6, which is functionally the same as the mixer embodiment of FIG. 7 if ideal switches are used. However, using real switches the mixer embodiment 100 shown in FIG. 6 is preferable, because it does not have two switches in series and allows the charges to redistribute during the complete "high" phase of the clock signal $\varphi_1$ instead of the shorter "high" phase of the clock signal $\varphi_{1b}$.

Figure 8:
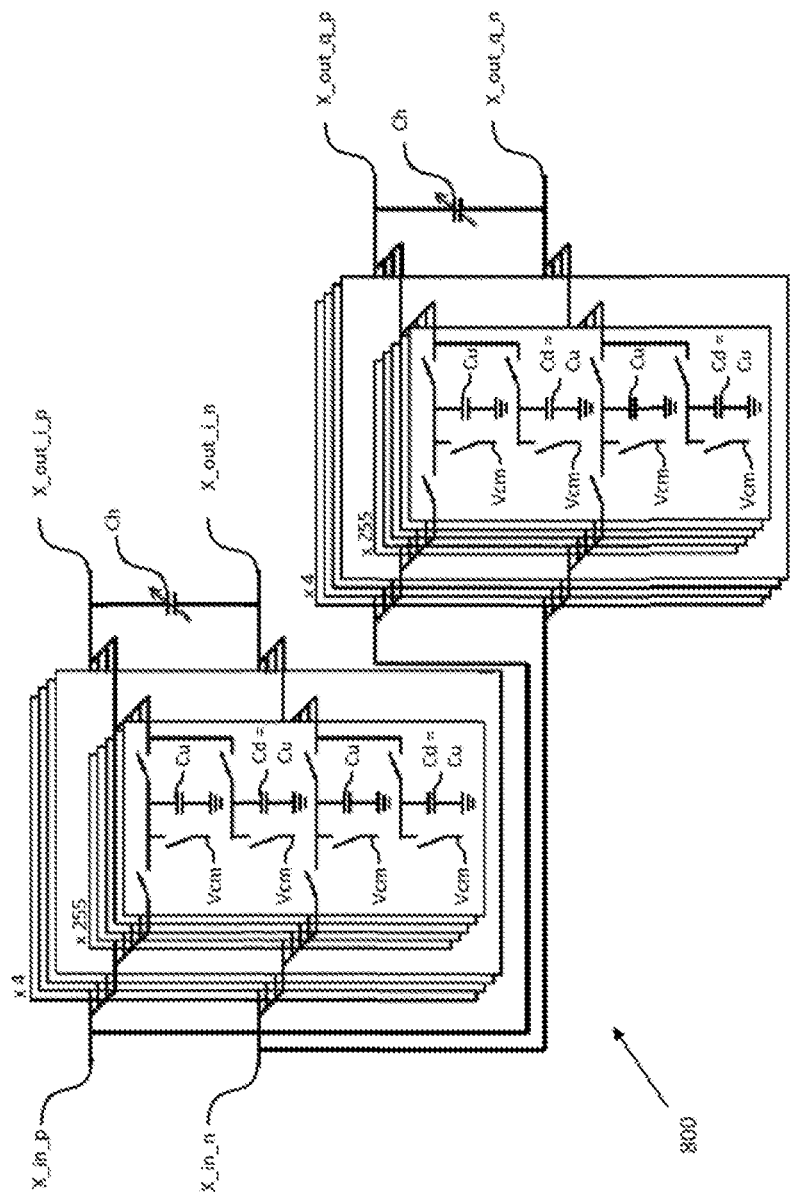
FIG. 8 shows a schematic diagram of a quadrature mixer for generating an analog output signal from an analog input signal using a mixing signal having a mixing frequency $f_{MIX}$ according to an embodiment.

FIG. 8 shows a schematic diagram of a mixer 800 for generating an analog output signal from an analog input signal using a mixing signal having an adjustable mixing frequency $f_{MIX}$ according to an embodiment. In the embodiment of FIG. 8 the mixer 800 is implemented in form of a quadrature mixer by connecting two of the mixer embodiments 100 shown in FIG. 6 in parallel. For the sake of simplicity, the additional switches for implementing a negative sign scaling coefficient are not shown in FIG. 8. Each mixer 100 of the quadrature mixer 800 is controlled by a different set of control codes n, which define respective mixing signals that are 90 degrees out of phase.

Figure 9C:
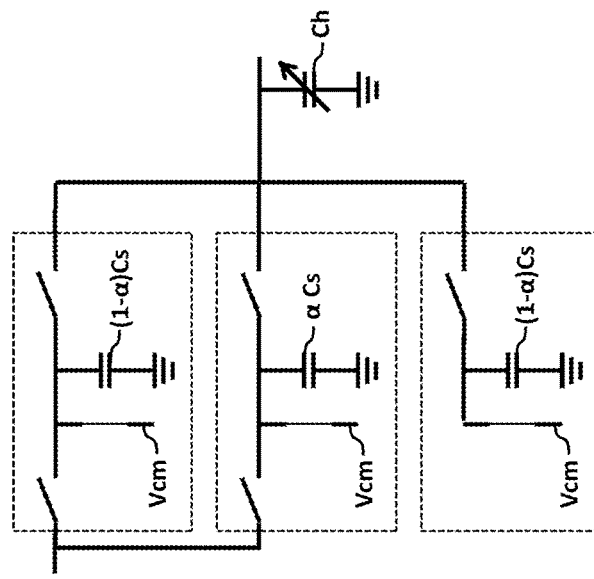
FIGS. 9a to 9c schematically illustrate the operational principle implemented in the mixer embodiments shown in FIGS. 6, 7 and 8 by showing selected components thereof during different clock phases.
Figure 9B:
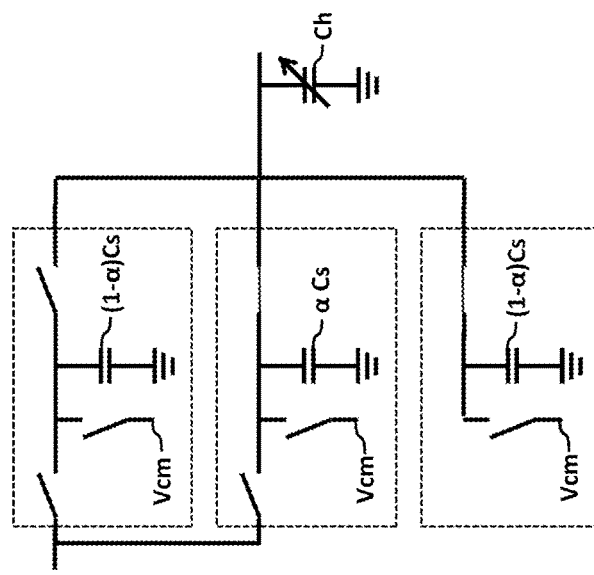
Figure 9A:
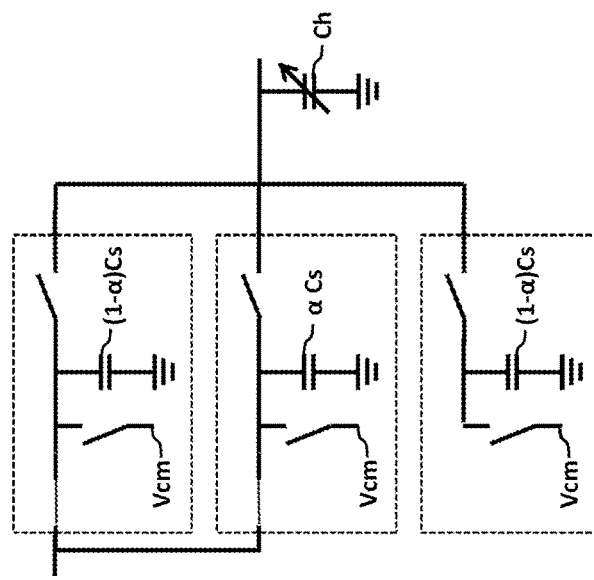

FIGS. 9a to 9c schematically illustrate the operational principle implemented in the mixer embodiments shown in FIGS. 6, 7 and 8 by showing selected components thereof. For illustration purposes the dummy unit capacitors $C_d$ have been separated into separate dummy unit cells. Each box in FIGS. 9a to 9c represents a variable number of unit cells or dummy unit cells depending on $\alpha$.

FIG. 9a shows the "high" phase of the clock signal $\varphi_0$, where the input is sampled on the total capacitance $C_s$. FIG. 9b shows the "high" phase of the clock signal $\varphi_1$, where the charge is transferred to the dummy unit cells having a capacitance of $(1-\alpha) \cdot C_s$ and to the hold capacitor $C_h$. The dummy unit cells make sure that the pole of the IIR filter stays at the same frequency.

FIG. 9c shows the "high" phase of the clock signal $\varphi_3$, where a reset of all capacitors is made.

In the below further variants of the mixer embodiment 100 shown in FIG. 6 will be described. Although the specific implementations differ, they have the same scaling factor $A[k]=\alpha$ and provide the same IIR filter as the mixer embodiment 100 shown in FIG. 6. Although not shown in the figures for the sake of simplicity, all implementations can have two mixer channels and four mixer blocks per channel.

FIGS. 10a to 10d schematically illustrates the operational principle implemented in a further mixer embodiment 100. As in the case of FIGS. 9a to 9c for illustration purposes only selected components of the further mixer embodiment 100 are shown in FIGS. 10a to 10d. Each box in FIGS. 10a to 10d represents a variable number of unit cells or dummy unit cells depending on $\alpha$.

The mixer 100 shown in FIGS. 10a to 10d does not require any dummy capacitors and uses all four clock signals $\varphi_0$, $\varphi_1$, $\varphi_2$ and $\varphi_3$.

During the "high" phase of the clock signal $\varphi_0$, the input is sampled on the unit capacitors $C_u$ of all N unit cells 140, i.e. on a total capacitance $C_s$, leading to a voltage $V_{IN}$ on each of the unit capacitors $C_u$ and a total charge $Q_s = C_s \cdot V_{IN}$.

During the "high" phase of the clock signal $\varphi_1$, (N-n) of these unit cells 140 are reset while the unit capacitors $C_u$ of the other unit cells 140 remain at a voltage $V_{IN}$. The total charge is now only $\alpha \cdot Q_s$.

During the "high" phase of the clock signal $\varphi_2$, all N unit cells 140 are connected to the hold capacitor $C_h$. Thus, the charge $\alpha \cdot Q_s$ plus the charge already present on the hold capacitor $C_h$ is redistributed over a total capacitance $C_s + C_h$. In this way, a scaling factor $A[k]=\alpha$ is realized and the same IIR filter as in the mixer embodiment shown in FIGS. 6 and 7 is implemented.

During the "high" phase of the clock signal $\varphi_3$, all unit capacitors $C_u$ are reset.

The main advantage of the mixer embodiment illustrated in FIGS. 10a-d is the absence of both the transfer capacitor $C_t$ and the dummy unit cells (i.e. the dummy unit capacitors). However, with respect to the mixer embodiment illustrated in FIGS. 10a-d the following should be taken into account. All four clock signals should be routed through the matrix of unit cells 140 in each block. This will lead to an increased power consumption and possibly even to an increased area necessary for the matrix of unit cells 140. Moreover, in addition to requiring the gating of the clock signal $\varphi_1$ with the digital control code n and the sign bits, in the mixer embodiment 100 illustrated in FIGS. 10a-d the clock signal $\varphi_1$ also should be combined with the clock signal $\varphi_3$ in an OR gate. Under certain circumstances the delay caused by such gating can become problematic, because all four clock signals are used, so that there is no buffer for delaying some of the clock signals.

FIGS. 11a to 11c schematically illustrate the operational principle implemented in a further mixer embodiment 100. As in the case of FIGS. 9a to 9c and FIGS. 10a to 10d for illustration purposes only selected components of the further mixer embodiment 100 are shown in FIGS. 11a to 11c. As in the case of FIGS. 9a to 9c the dummy unit capacitors $C_d$ have been separated into separate dummy unit cells. Each box in FIGS. 11a to 11c represents a variable number of unit cells or dummy unit cells depending on $\alpha$.

Similar to the mixer embodiments 100 shown in FIGS. 6, 7, 8 and 9a to 9c, the mixer 100 shown in FIGS. 11a to 11c also comprises dummy unit capacitors $C_d$. However, in the mixer 100 shown in FIGS. 11a to 11c these dummy unit capacitors $C_d$ are connected not to the output terminal 130, but rather to the input terminal 120 via a dummy unit cell input switch. Consequently, in this embodiment clock gating is done on the dummy unit cell input switch.

During the "high" phase of the clock signal $\varphi_0$, the input signal is sampled on n unit capacitors $C_u$ and (N-n) dummy capacitors $C_d$ (with $C_d = C_u$), so that the total (sampling) capacitance is always equal to $C_s$. This results in a voltage $V_{IN}$ and a total charge $Q_s = C_s \cdot V_{IN}$. The dummy unit cells make sure that the input load is always equal to $C_s$.

During the "high" phase of the clock signal $\varphi_1$, all N unit capacitors $C_u$ (the n unit capacitors $C_u$ which sampled the input signal and the (N-n) unit capacitors $C_u$ which did not sample the input signal) connect to the hold capacitor $C_h$, so that also in this embodiment a total charge $\alpha \cdot Q_s$ plus the charge present on the hold capacitor $C_h$ is redistributed over the capacitance $C_s + C_h$. As in the previous embodiments, this leads to a scaling factor $A[k]=\alpha$ and the same IIR filter implementation.

In this mixer embodiment 100 the clock signal $\varphi_2$ is not used. During the high phase of clock signal $\varphi_3$ all capacitors $C_u$ and $C_d$ are reset.

With respect to the mixer embodiment 100 shown in FIGS. 11a to 11c one has to appreciate that the clock gating now occurs on the input switch, which is the only timing-critical switch, since it determines at which point in time the input signal is sampled and, in case of a current input signal, how long it is integrated.

As already mentioned above, the above described mixer embodiments 100 can be implemented in form of a quadrature mixer providing for an in phase output signal and a quadrature output signal.

For instance, the quadrature mixer embodiment 500 shown in FIG. 5 and the quadrature mixer embodiment 800 shown in FIG. 8 have two identical and independent mixers 100 for the I and Q paths. During each clock cycle, each mixer 100 samples the input on a capacitance $C_S$, which results in a total charge $Q_s = C_s \cdot V_{IN}$. The only case in which all this charge will be used (i.e. connected to the hold capacitor $C_h$) is when $\alpha=1$ (for instance at the peaks of the mixing signal in case of a sinusoidal mixing signal). In the more common case of $\alpha<1$, part of the charge remains on the sampling capacitors until it is discarded in the reset phase without ever being involved in the charge redistribution process. Nevertheless, the total (sampling) capacitance $C_s$ needs to be the same during every clock cycle so that the signal source is always driving the same impedance.

During each clock cycle, the I and Q phases together take a charge $2 \cdot Q_s$ from the source of the input signal and store it on a total capacitance of $2 \cdot C_s$. However, there is no case in which all this charge will be used. As the I and Q mixing signals are 90 degrees out of phase, their peaks do not coincide, i.e. it is impossible that α of the I channel (hereinafter referred to as $α_i$) and α of the Q channel (hereinafter referred to as $α_q$) are equal to 1 at the same point in time.

It can easily be shown that $$\max(α_i + α_q) = \max_x(|\cos x| + |\sin x|) = \sqrt{2} \quad (12)$$

This means that in order to keep the input impedance of the mixers 100 of the I channel and the Q channels together during all clock cycles, it is sufficient to sample the input signal on a total capacitance of $$C_{TOT}\sqrt{2}\cdot C_s \quad (13)$$

Furthermore, it can be shown that $$\min(α_i + α_q) = \min_x(|\cos x| + |\sin x|) = 1 \quad (14)$$

Figure 12:
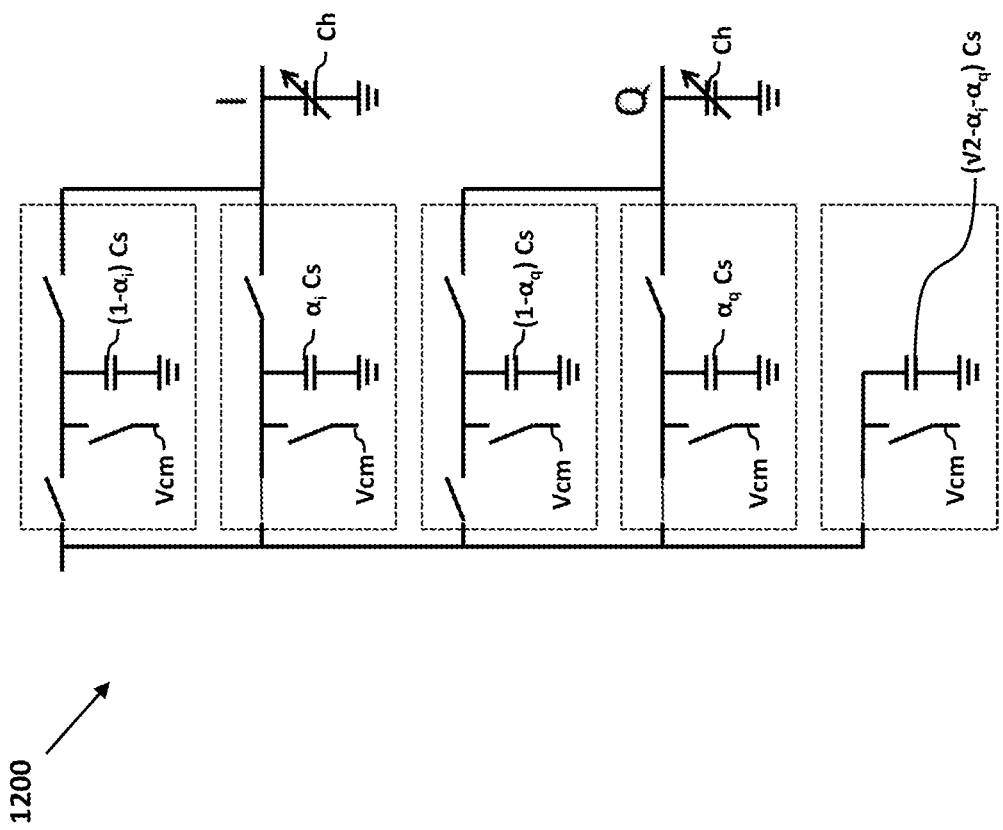
FIG. 12 shows a schematic diagram of a quadrature mixer for generating an analog output signal from an analog input signal using a mixing signal having a mixing frequency $f_{MIX}$ according to an embodiment.

This finding leads to the quadrature mixer embodiment 1200 shown in FIG. 12, which is based on the above described mixer embodiments 100. Similar to the mixer embodiment shown in FIGS. 10a to 10d it also includes N unit capacitors $C_u$ in both the I channel mixer and the Q channel mixer. However, it only includes about $(\sqrt{2}-1)\cdot N$ dummy capacitors $C_d$. Thus, the total capacitance is given by $$2NC_u + (\sqrt{2}-1)NC_d = (1+\sqrt{2})C_s \approx 2.4C_s \quad (15)$$

In comparison to the mixer embodiment shown in FIGS. 10a to 10d, where for a quadrature implementation the total capacitance would be $2NC_u + 2NC_d = 4C_s$, a total capacitance of only $2.4\cdot C_s$ translates into a substantially reduced area.

Moreover, in the quadrature mixer embodiment 1200 shown in FIG. 12 the input capacitance during the sampling phase has been reduced by a factor of $\sqrt{2}$, which facilitates the design of the signal source that drives the mixer.

Figure 13:
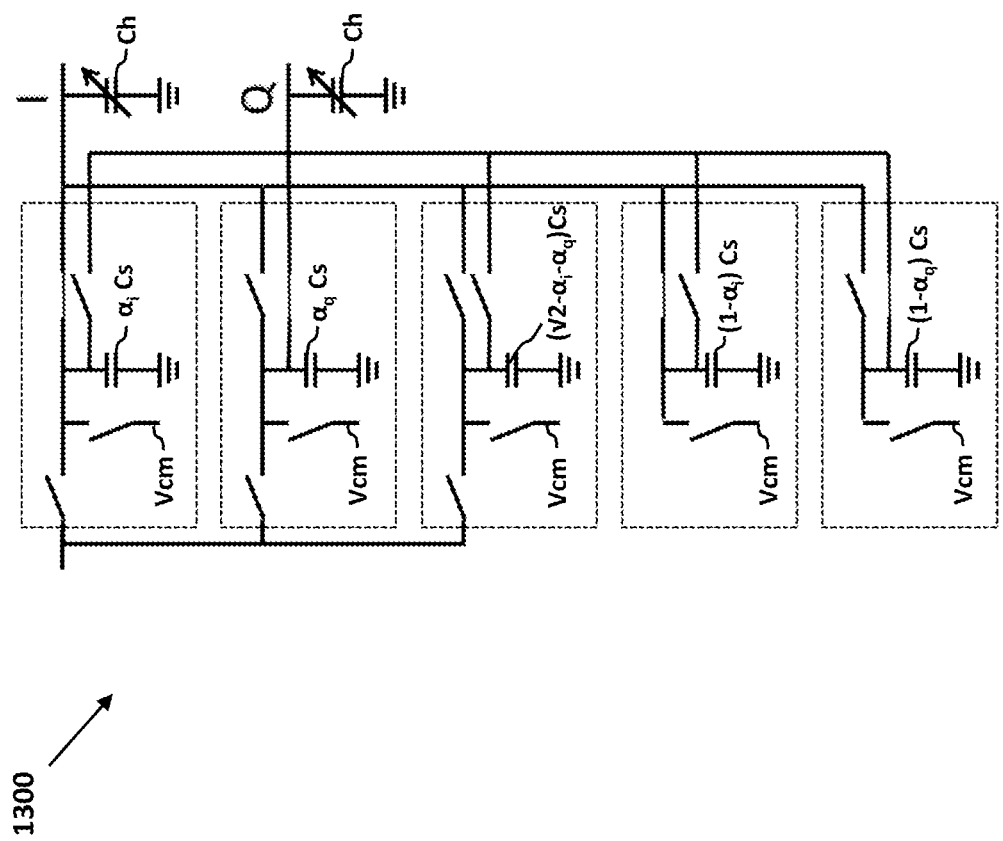
FIG. 13 shows a schematic diagram of a quadrature mixer for generating an analog output signal from an analog input signal using a mixing signal having a mixing frequency $f_{MIX}$ according to an embodiment.

FIG. 13 shows a further quadrature mixer embodiment 1300 based on the above described mixer embodiments 100. Similar to the quadrature mixer embodiment 1200 of FIG. 12 the quadrature mixer embodiment 1300 of FIG. 13 is implemented for sharing unit cells 140 between the I channel and the Q channel of the quadrature mixer. However, different to the quadrature mixer embodiment 1200 of FIG. 12 in the quadrature mixer embodiment 1300 of FIG. 13 the clock gating is performed on the output switches based on the mixer embodiments 100 shown in FIGS. 6 and 7.

In the quadrature mixer embodiment 1300 shown in FIG. 13 the input signal is sampled on about $\sqrt{2}\cdot N$ unit capacitors $C_u$ resulting in a total capacitance of about $\sqrt{2}\cdot C_s$. During the "high" phase of the next clock signal, $n_i$ of these unit cells 140 are connected to the hold capacitor $C_h$ in the I channel and $n_q$ of these unit cells 140 are connected to the hold capacitor $C_h$ in the Q channel of the quadrature mixer embodiment 1300, wherein $0 \leq n_i \leq N$, $0 \leq n_q \leq N$ and $N \leq n_i + n_q \leq \sqrt{2}\cdot N$. At the same time, dummy unit cells are included in both channels in order to achieve a total capacitance $C_s$ in each channel.

For the quadrature mixer embodiment 1300 shown in FIG. 13 only about $\sqrt{2}\cdot N$ unit capacitors $C_u$ and about $(2-\sqrt{2})N$ dummy capacitors $C_d$ are required, which means that the total capacitance is only $2C_s$. Actually, this represents the lowest achievable total capacitance, because during the charge sharing phase each of the channels I and Q needs a total capacitance of $C_s$ to be connected to the hold capacitor $C_h$. Moreover, in the quadrate mixer embodiment 1300 shown in FIG. 13 the clock gating has been shifted from the timing-sensitive input switches to the output switches.

However, in comparison to the quadrature mixer embodiment 1200 shown in FIG. 12 the quadrature mixer embodiment 1300 shown in FIG. 13 requires additional switches so that the unit cells and the dummy cells can be connected to the output either of the I channel or of the Q channel. These additional switches can add more parasitic capacitance. Moreover, the signal routing can become more complicated.

In the below additional embodiments of the mixer 100 will be described that in comparison to the mixer embodiments shown in FIGS. 3 and 6 comprise differently configured unit cells 140 and/or blocks of unit cells 140. The unit cells discussed below can either be implemented using an architecture including a transfer capacitor $C_t$ or dummy unit cells in order to keep the total capacitance involved in sampling and charge transfer to $C_h$ equal to $C_s$.

As already described above, a unit cell 140 of the mixer 100 shown in FIG. 3 is controlled by three clock signals and one data bit based on the control code. This means that the sign bit and the three clock signals need to be routed to every single unit cell 140 in a given block 350 of unit cells 140 of the mixer 100 shown in FIG. 3. In addition, each unit cell 140 also requires one of the control code data bits. In an alternative embodiment, the clock signal $φ_1$ can be gated with the sign bit and its inverse outside of the matrix of unit cells 140 and then distributed thereover. In this case, two clock signals, i.e. $Ψ_0$ and $φ_3$, and two gated clock signals, i.e. "$φ_1$ & sign" and "$φ_1$ & sign", need to be routed to every unit cell 140 in a given block 350 of unit cells 140 and, in addition, each unit cell 140 still has to be provided with one of the control code data bits. In both cases, this routing can cause significant parasitic capacitance and thus influence or even dominate both the power consumption of the clock signal and data drivers and the input impedance of the mixer 100 shown in FIG. 3. This situation might be improved by increasing the spacing between wires, but this will increase the size of the matrix of unit cells 140, which, in turn, can increase the capacitance to the substrate on which the mixer 140 is implemented.

Several options exist to reduce the number of signals routed through the matrix of a unit cell 140 of the mixer shown in FIG. 3. All these options require additional switches and have at least two switches in series during at least some of the "high" phases of the clock signals. In order to keep the on-resistance the same, switches that are in series need to be wider, which in turn increases their gate capacitance.

Figure 14:
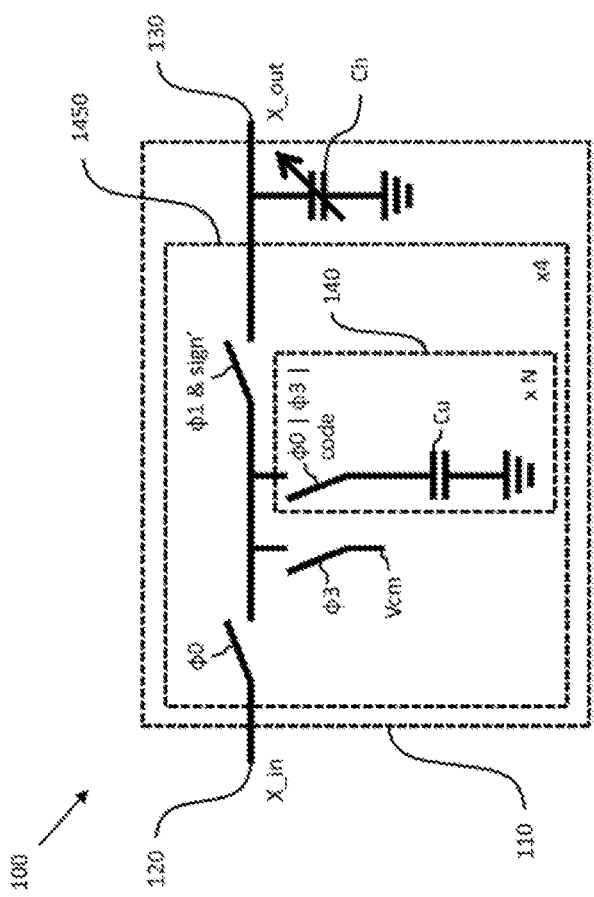
FIG. 14 shows a schematic diagram of a mixer for generating an analog output signal from an analog input signal using a mixing signal having a mixing frequency $f_{MIX}$ according to an embodiment.

FIG. 14 shows a schematic diagram of a mixer 100 for generating an analog output signal $X_{OUT}$ from an analog input signal $X_{IN}$ using a mixing signal having an adjustable mixing frequency $f_{MIX}$ according to an embodiment. The mixer 100 comprises a scaler 110 being configured to sample the analog input signal at a plurality of discrete points in time k with a sampling frequency $f_S$ at an input terminal 120 of the mixer 100 to obtain a sampled analog input signal having a continuous signal value, and to generate the analog output signal at an output terminal 130 of the mixer 100 having a continuous signal value by scaling the sampled analog input signal on the basis of a plurality of scaling coefficients A[k], i.e. $X_{OUT}=A[k]X_{IN}[k]$. The scaling coefficients A[k] are a time-discrete representation of the mixing signal.

The embodiment of the mixer 100 shown in FIG. 14 comprises in each unit cell 140 a further switch in series with the unit capacitor $C_u$. This configuration allows that all other switches can be shared by all N unit cells 140 in the block 1450 and taken out of the unit cell and, thus, out of the matrix. In this embodiment of the mixer 100 a unit cell 140 consists of only one switch and the unit capacitor $C_u$ and is controlled by only one gated clock signal and one data bit based on the control code. The gated clock signal "$\varphi_0|\varphi_3$", wherein "I" stands for the logical OR operation, shown as reference to the switch of the unit cell 140 in FIG. 14 can be generated outside the matrix and then routed to every unit cell 140 so it should be counted as only one clock signal.

For this embodiment the other clock signals, as well as the sign bit, are only necessary outside the matrix, i.e. outside the N unit cells 140. While the clock signals drive the same number of switches (which all should be twice as large, since during every "high" clock phase two switches are in series), their total load capacitance can still be smaller due to the fact that the load is concentrated in one place rather than being spread out over a large matrix so that routing capacitance can be significantly reduced.

For the embodiment of the mixer 100 shown in FIG. 14 it has to be taken into account that there will be some parasitic capacitance on the node where all switches connect. This parasitic capacitance might probably be quite large, since the node is spread out over the matrix of unit cells 140 and may therefore have a large routing capacitance. This parasitic capacitance is always present even if the control code n is set to 0, and it will always transfer some charge from the input terminal 120 to the output terminal 130, i.e. there is a parasitic charge path through the embodiment of the mixer 100 shown in FIG. 14. This poses a lower limit on the scaling coefficient or voltage gain A[k]. If this lower limit is low enough so that all required mixing signal samples can still be realized, this is no problem, but if the smallest mixing signal samples cannot be represented, this will lead to a distortion of the output signal.

This potential problem does not occur, for instance, in the unit cell 140 of the mixer 100 shown in FIG. 3. In case the control code n is zero in the embodiment of the mixer 100 shown in FIG. 3 none of the transfer switches will close and no charge is transferred to the transfer capacitor $C_t$ and the hold capacitor $C_h$.

Figure 15:
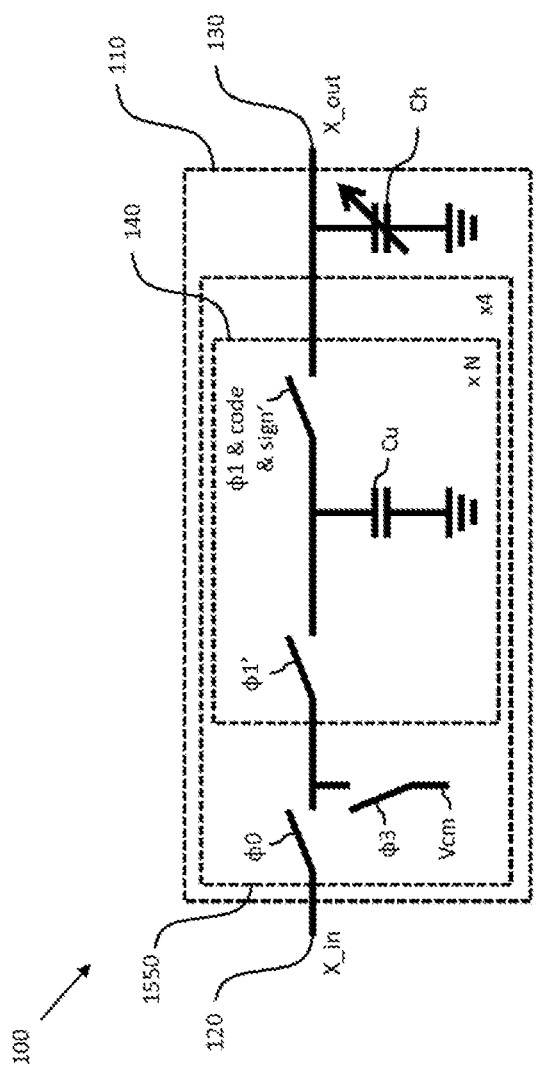
FIG. 15 shows a schematic diagram of a mixer for generating an analog output signal from an analog input signal using a mixing signal having a mixing frequency $f_{MIX}$ according to an embodiment.

The above described potential problem does also not occur in the embodiment of the mixer 100 shown in FIG. 15 by having separate input and output switches. In case the control code n is zero in the embodiment of the mixer 100 shown in FIG. 15, the output switches will all stay open and no charge is transferred to the hold capacitor $C_h$. The additional input switch still allows putting the sampling and reset switches outside of the matrix, i.e. outside of the N unit cells 140. Each unit cell 140 contains three switches (including the sign inversion switch which is not shown in FIG. 15) and requires one clock signal $\varphi_1$, one control code data bit and the sign bit. In an alternative embodiment, the clock signal $\varphi_1$ can be gated with the sign bit (and its inverse) at the top level and then distributed over the matrix of unit cells 140. In this case, one clock signal, two gated clock signals and one control code data bit are required, but this is likely to consume more power since the combined activity of the clock signals is higher than that of the sign bit.

Figure 16:
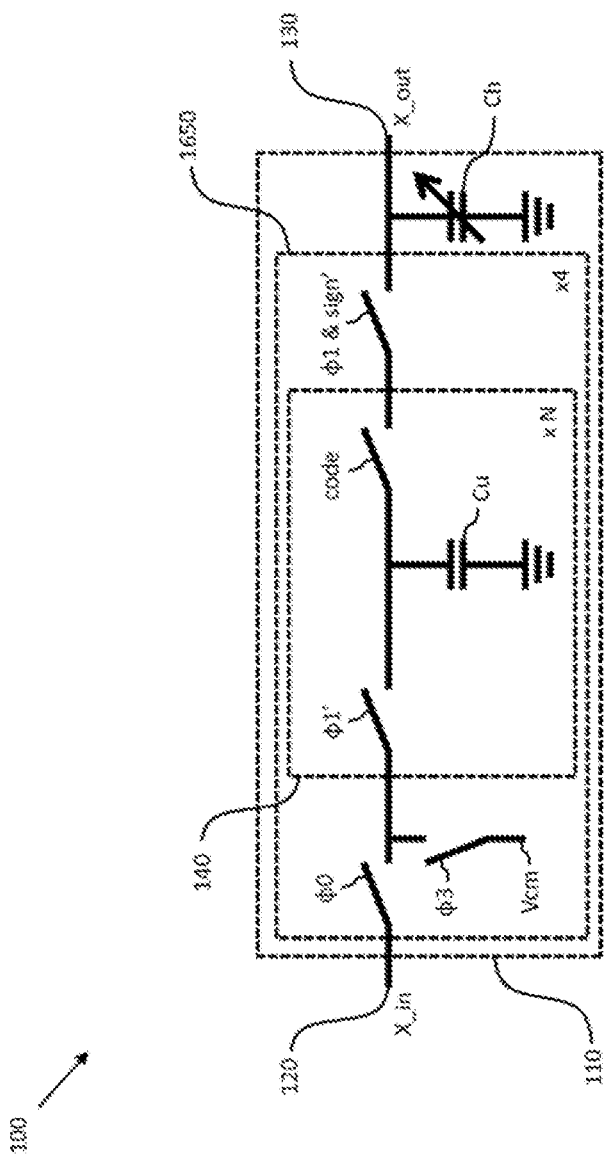
FIG. 16 shows a schematic diagram of a mixer for generating an analog output signal from an analog input signal using a mixing signal having a mixing frequency $f_{MIX}$ according to an embodiment.

FIG. 16 shows a schematic diagram of a mixer 100 for generating an analog output signal $X_{OUT}$ from an analog input signal $X_{IN}$ using a mixing signal having an adjustable mixing frequency $f_{MIX}$ according to a further embodiment.

The configuration of the N unit cells 140 of the blocks 1650 of the embodiment of the mixer 100 shown in FIG. 16 allows for a removal of the sign bit from the matrix of unit cells 140. In this embodiment the two output switches (for positive and negative sign; only the positive one is shown in FIG. 16) are moved outside of the unit cell 140, which is made possible by adding an extra switch controlled by the control code inside the unit cell 140. Thus, the unit cell 140 now contains two switches and requires one clock signal $\varphi_1'$ (wherein $\varphi_1'$ is the inverse of the clock signal $\varphi_1$) and one control code data bit.

Figure 17:
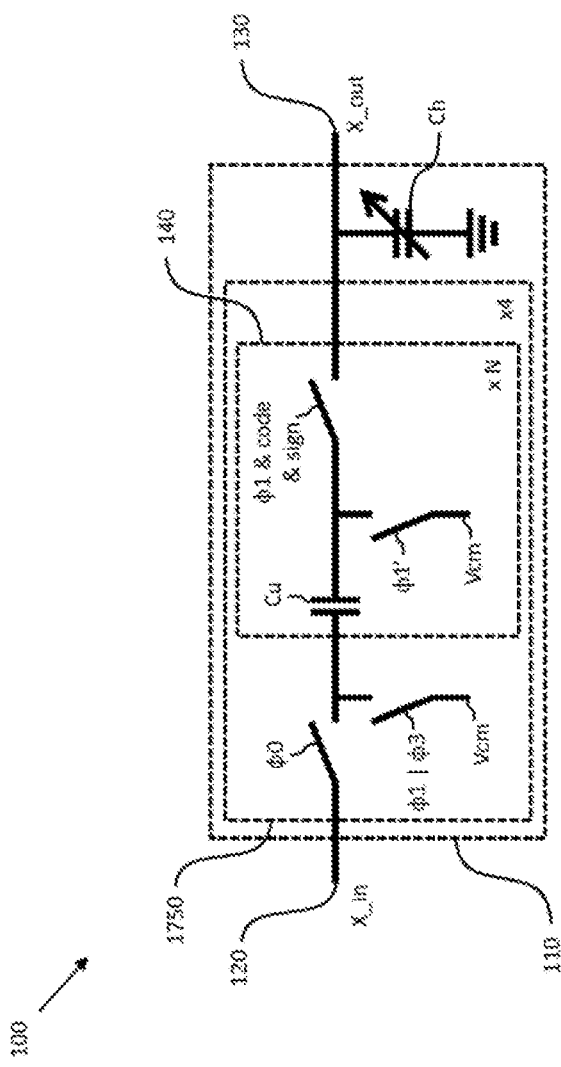
FIG. 17 shows a schematic diagram of a mixer for generating an analog output signal from an analog input signal using a mixing signal having a mixing frequency $f_{MIX}$ according to an embodiment.

FIG. 17 shows a schematic diagram of a mixer 100 for generating an analog output signal $X_{OUT}$ from an analog input signal $X_{IN}$ using a mixing signal having an adjustable mixing frequency $f_{MIX}$ according to a further embodiment based on a modification of the embodiment of the mixer 100 shown in FIG. 15. In this embodiment the unit cell 140 is inverting, but this is generally not a problem, because the mixer 100 is implemented as a differential mixer. It can be shown that for the embodiment of the mixer 100 shown in FIG. 17 there is still no parasitic charge path. As in the case of the embodiment shown in FIG. 15, the unit cell 140 of the mixer 100 shown in FIG. 17 contains two switches and requires one clock signal $\varphi_1$, one control code data bit and the sign bit. However, as now there are two switches in series during each clock signal phase (one on each side of the unit cell capacitor $C_U$), the widths of all switches need to be doubled. Also, an additional clock signal "$\varphi_1|\varphi_3$" needs to be produced.

Figure 18:
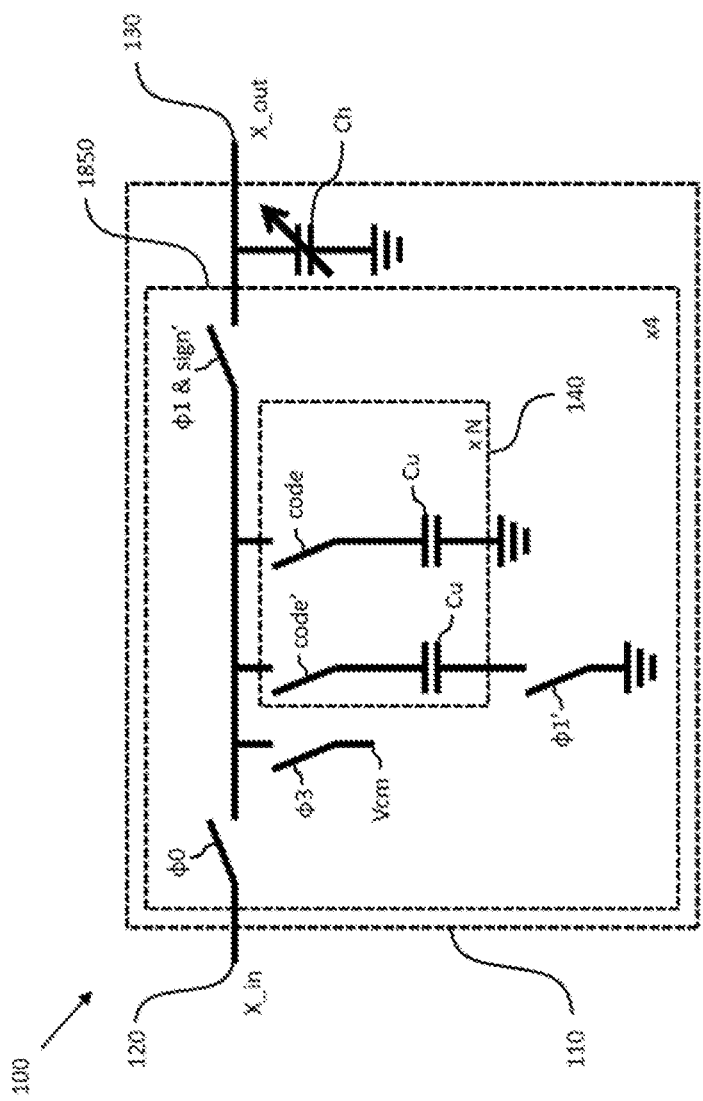
FIG. 18 shows a schematic diagram of a mixer for generating an analog output signal from an analog input signal using a mixing signal having a mixing frequency $f_{MIX}$ according to an embodiment.

FIG. 18 shows a schematic diagram of a mixer 100 for generating an analog output signal $X_{OUT}$ from an analog input signal $X_{IN}$ using a mixing signal having an adjustable mixing frequency $f_{MIX}$ according to a further embodiment. The unit cell 140 of the mixer 100 shown in FIG. 18 provides the advantage of requiring no clock signals at all. In the embodiment of the mixer 100 shown in FIG. 18 all switches controlled by one of the clock signals have been moved outside of the matrix of unit cells 140. The only signal directed to a unit cell 140 is the control code bit. An effect of this is that the sampling capacitor is already disconnected during the sampling phase. For this reason, a dummy capacitor is added (on the left of the unit cell 140 in FIG. 1), which is disconnected by means of the clock signal $\varphi_1'$, i.e. the inverted clock signal $\varphi_1$, when the output switch is closed (by means of the clock signal $\varphi_1$).

The unit cell 140 of the embodiment of the mixer 100 shown in FIG. 18 requires the control code data bit to change during the unused clock phase $\varphi_2$. In that way, the capacitor that will be used for sampling is already connected during the "high" phase of the clock signal $\varphi_3$ so that it is correctly reset.

Figure 19:
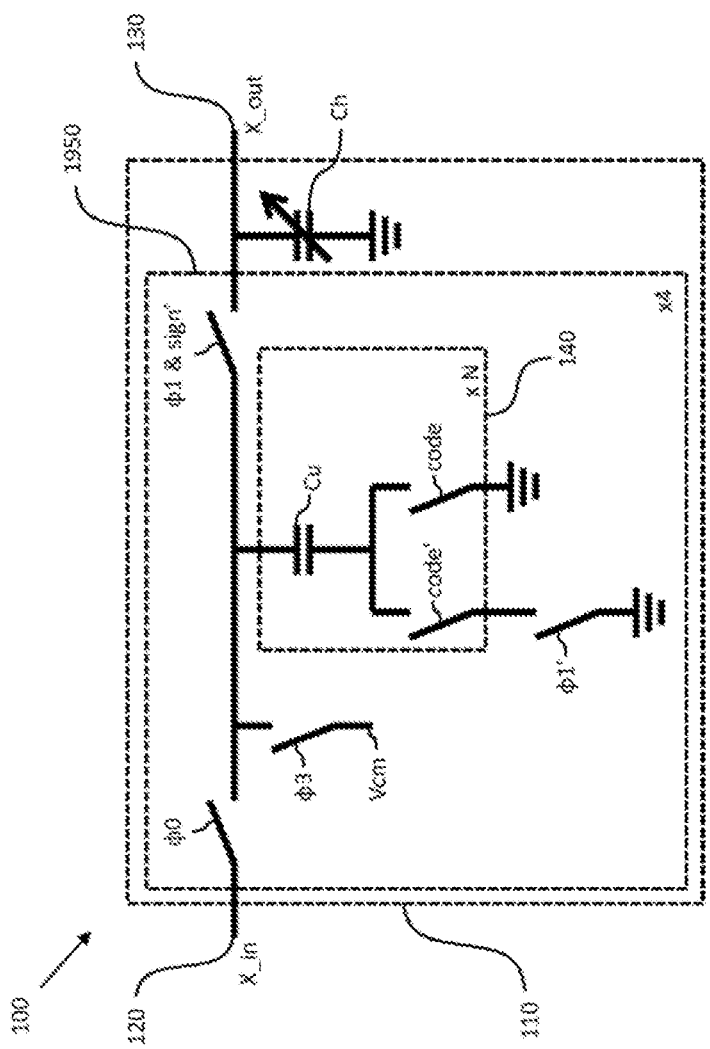
FIG. 19 shows a schematic diagram of a mixer for generating an analog output signal from an analog input signal using a mixing signal having a mixing frequency $f_{MIX}$ according to an embodiment.

FIG. 19 shows a schematic diagram of a mixer 100 for generating an analog output signal $X_{OUT}$ from an analog input signal $X_{IN}$ using a mixing signal having an adjustable mixing frequency $f_{MIX}$ according to a further embodiment based on a modification of the embodiment of the mixer 100 shown in FIG. 18. The unit cell 140 of the embodiment of the mixer 100 shown in FIG. 19 comprises only a single unit capacitor $C_u$. However, in this embodiment the parasitic charge path can be expected to transfer even more charge, since it now also includes the parasitic capacitance of the unit capacitor $C_u$, which is usually larger than the parasitics of the switches.

Figure 20:
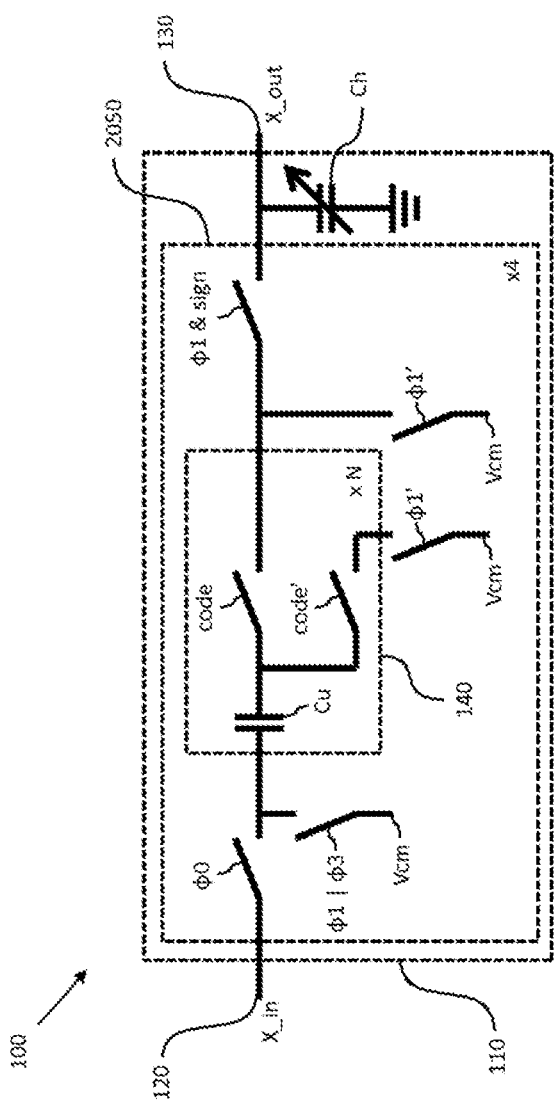
FIG. 20 shows a schematic diagram of a mixer for generating an analog output signal from an analog input signal using a mixing signal having a mixing frequency $f_{MIX}$ according to an embodiment.

FIG. 20 shows a schematic diagram of a mixer 100 for generating an analog output signal $X_{OUT}$ from an analog input signal $X_{IN}$ using a mixing signal having an adjustable mixing frequency $f_{MIX}$ according to a further embodiment based on a modification of the embodiment of the mixer 100 shown in FIG. 19. The configuration of the unit cell 140 of the embodiment of the mixer 100 shown in FIG. 20 removes the parasitic charge path, while still requiring only one unit capacitor $C_u$. However, in this embodiment there are now three switches in series during any clock phase.

Figure 21:
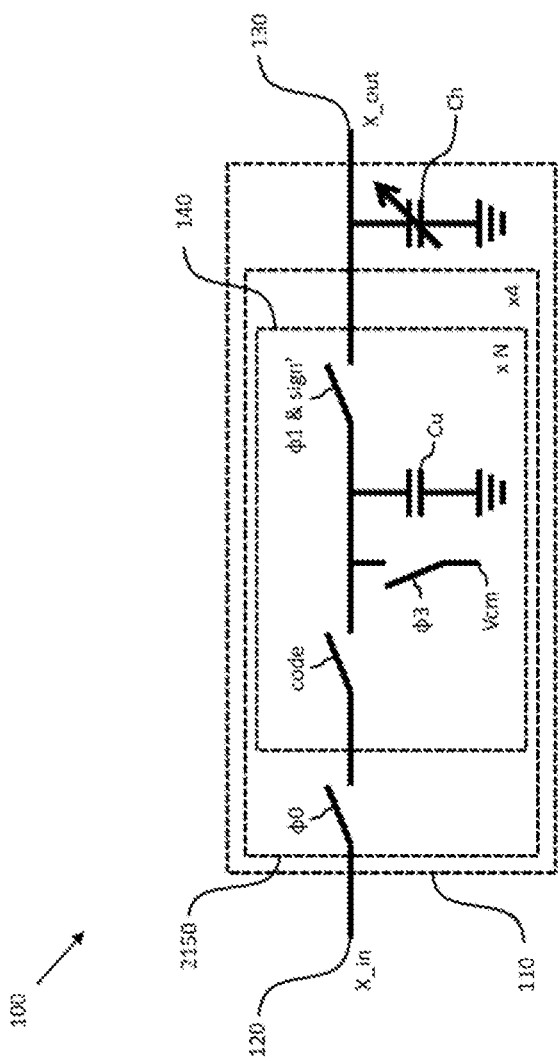
FIG. 21 shows a schematic diagram of a mixer for generating an analog output signal from an analog input signal using a mixing signal having a mixing frequency $f_{MIX}$ according to an embodiment.

FIG. 21 shows a schematic diagram of a mixer 100 for generating an analog output signal $X_{OUT}$ from an analog input signal $X_{IN}$ using a mixing signal having an adjustable mixing frequency $f_{MIX}$ according to a further embodiment based on a modification of the embodiment of the mixer 100 shown in FIG. 3. The difference is that the control code is no longer controlling the output switch, but a duplicated version of the input switch. This is particularly interesting for the mixer embodiments 100 shown in FIGS. 11*a*-*c* and 12, which have dummy unit cells connected to the input terminal 120. The unit cells 140 shown in FIG. 21 allow exploiting the benefits of the mixer embodiments 100 shown in FIGS. 11*a*-*c* and 12 without having to gate the clock signal that controls the input switch. The first input switch is now directly controlled by a clock signal, which allows accurate timing of the edges. The second input switch is controlled only by a control code data bit, which can be set well before the clock edge of the sampling clock signal, so that it does not cause any timing issues.

In the below different effects of the choice of the mixing frequency $f_{MIX}$ will be described, which apply to essentially all of the mixer embodiments described above. The mixing frequency $f_{MIX}$ is best chosen such that its ratio to the sampling frequency $f_S$ is a rational number, i.e.

$$\frac{f_{MIX}}{f_S} = \frac{A}{B} \quad (16)$$

where A and B are integers. In this case, the mixing signal will be periodical when sampled at $f_s$ so that it can be stored in a lookup table (LUT) or periodical shift register of limited size of the mixer 100.

If the ratio is not a rational number, the sampled representation of the mixing signal will not be periodical even though the analog mixing signal is periodical. In this case, the mixing signal samples need to be calculated at runtime, which requires much more computation resources and thus more area and power.

It can be shown that the period of the mixing signal sampled at $f_S$ is L samples, where L is given by $$L = \frac{B}{gcd(A, B)} \quad (17)$$

where gcd(x,y) is the greatest common divisor of x and y. Thus, in the general case, a LUT of L samples is required, which samples at $f_S$. However, if the mixer 100 is implemented as a polyphase mixer, where each phase samples at $f_{LO}=f_S/4$ and processes only every 4th sample, it is easier to include one LUT per mixer block, so that the LUTS only need to sample at $f_{LO}$ as well. If L is a multiple of 4, the samples can be distributed over the 4 sub-LUTS so that each sub-LUT contains only L/4 samples. If L is a multiple of 2 but not of 4, each sub-LUT will contain L/2 samples, and if it is not a multiple of 2, each sub-LUT will contain the same L samples but in a different order. To summarize, each sub-LUT contains M samples, where $$M = \frac{L}{gcd(L, 4)} = \frac{B}{gcd(4A, B)} \quad (18)$$

In general, requiring $f_{MIX}$ to coincide with the input signal frequency can result in a quite large value for M since the minimal numbers A and B are large. However, usually a nonzero intermediate frequency (IF) is preferred and there is some flexibility in choosing the IF, and thus also in choosing $f_{MIX}$. In this case, $f_{MIX}$ can be chosen such that A and B are fairly small numbers and M can be kept low.

Due to the finite number of unit cells 140, mixing signal samples will have to be rounded, which causes quantization noise. This quantization noise will also be periodical with the LUT length M, so that it will show up as spurs at discrete frequencies in the mixing signal spectrum rather than as a noise floor as one might expect. The spacing between the spurs is given by $$\Delta f_{spur} = \frac{f_S}{M} = \frac{gcd(4A, B)}{D} \cdot f_S \quad (19)$$

wherein the spurs can occur at all frequencies $$f_{spur,k} = f_{MIX} + k \cdot \Delta f_{spur} \forall k \in \mathbb{Z} \quad (20)$$

Thus, the selection of the ratio A/B is a trade-off between the LUT length M (usually the least important effect), the spur spacing $\Delta f_{spur}$ and the intermediate frequency (IF). Usually the best strategy is to maximize $\Delta f_{spur}$ while keeping the IF within boundaries. The higher the spacing between the spurs and the desired signal, the easier it will be to filter out the spurs after mixing (they will then be at $f_{IF}+k\cdot\Delta f_{spur}$). The height of the LO spurs can only be improved by adding more bits, i.e. more unit cells 140 to the mixer 100.

In an embodiment, the mixer 100 is configured to mix the input signal with a mixing signal having a frequency $f_{LO}$, for instance, for bands where the duplex distance is not too high. In the context of the above equation (16) this means that A=1 and B=4 so that $$\frac{f_{MIX}}{f_{LO}} = \frac{f_{MIX}}{f_S/4} = \frac{4A}{B} = 1$$

It then follows that L=4 and M=1, and the LO samples stored in the LUT reduce to the sequence {1, 0, −1, 0}. A large advantage of this is that these samples perfectly represent a sinusoid with amplitude 1 without any quantization noise. Thus, there will be no quantization noise spurs.

In this particular case, it is also possible to implement a mixing signal with an amplitude of √2 without any quantization noise, by replacing the LUT samples by the sequence {1, 1, −1, −1}. This will reduce the mixer loss by 3 dB while still not introducing any quantization noise. This optimization is not possible in general since in general the LUT stores multiple periods of the mixing signal sampled at different time points, so that one of the samples will occur at or close to the peak of the mixing signal and thus needs to be larger than 1. This is not possible as the highest possible value for the scaling coefficient A[k] is α=1.

When $f_{MIX}=f_{LO}$, all unit cells 140 in one block 350 of the mixer 100 are permanently on (for samples 1 and −1) or permanently off (for samples 0), and such a mixer 100 operates as a complicated implementation of a traditional passive mixer.

Several of the mixer embodiments 100 described above comprise four mixer blocks (or mixer phases) 350 of unit cells 140. However, as already mentioned above, having four mixer blocks is not essential for the mixer 100 to work, but just a way to achieve an effective sampling rate of $4f_{LO}$ using only 25% duty-cycle clock signals at $f_{LO}$.

For low frequencies $f_{LO}$ or fast transistor technologies, it can be possible to implement a mixer 100 with a single mixer block per channel (i.e. one block for the I channel and one for the Q channel). In this case, four 25% clock signals with clock frequency $f_S=4f_{LO}$ are required. In this way, the different processing steps of the mixer 100 can all be completed during one $T_S$ period, so that the same block of the mixer 100 can be used to process the next sample. Such a single block mixer 100 differs from a 4-block mixer 100 in the following respects.

The 4-block mixer 100 connects each block or phase to the input for a full $T_S$ period. Thus, with the exception of the moments when the clock signals are switching, the signal source always has to drive the same load. The single block mixer 100 only connects its sampling capacitor to the input during 25% of the sampling period $T_S$. Hence the signal source must be able to handle a strongly variable load.

The available settling time for sampling, charge-sharing and resetting is now $T_S/4$ instead of $T_S$ for the 4-block mixer 100. This means that to achieve equally good settling, all switches of the single block mixer 100 will have to be 4 times wider than in the 4-block mixer 100.

Because of the increased switches, the input capacitance per mixer block is 4 times higher. However, this is compensated by the fact that there is only one mixer block instead of 4. Thus the total clock load is the same, and since the clock frequency is 4 times higher, a 4 times higher power consumption can be expected.

Similarly, a mixer 100 with 2 mixer blocks per channel can be implemented, which uses four 25% clock signals at $2f_{LO}$. The implications are similar as for the single block mixer 100. The 2-block mixer 100 only connects one of its sampling capacitors to the input for 50% of the time, so the signal source must be able to handle a variable load. The switches of the 2-block mixer 100 have to be twice as large as in the 4-block mixer 100. The power consumption will be twice as high as in the 4-block mixer 100.

The higher power for mixers 100 with fewer blocks indicates an interesting tendency which can also be exploited in the other direction, by implementing a mixer 100 with e.g. 8 mixer blocks per channel. In this case eight 25% clock signals at $f_{LO}/2$ are needed, where the clock signal pulse of a clock signal phase overlaps with the pulses of the adjacent clock signal phases. Since the sampling clock signals overlap, the 8-block mixer 100 connects 2 of its blocks to the input simultaneously at any moment in time. Thus the source does not have to handle a variable load but the load will be higher than for the 4-block mixer 100. In addition, the parasitic input capacitance of the 8-block mixer 100 will be higher as now the parasitics of 8 blocks per channel are connected to the input. The switches need to be only half as large as in the 4-block mixer 100. The power consumption will be only half as high as in the 4-block mixer 100. This is an interesting way to reduce the power consumption at the expense of doubled area and input capacitance.

Alternatively, non-overlapping 12.5% clock signal phases can be used to control the sampling switches of the 8-block mixer 100, so that the settling time is the same as in the 4-block mixer 100 and the switches need to have the same size. In this way, the source that drives the input will have to drive the same load as in the 4-block mixer 100. Meanwhile, the other switches can be halved and controlled by overlapping 25% clock signals. This still saves power but less than in the above architecture.

The person skilled in the art will appreciate that the above multi block mixer embodiments 100 can be further extended to a 16-block mixer, a 32-block mixers, and so on.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

The invention claimed is:

1. A mixer, comprising:
an input control switch, configured to sample an analog input signal $X_{IN}$ based on a first clock signal;
a scaler, configured to control the input control switch and sample the analog input signal $X_{IN}$ at a plurality of discrete points in time k with a sampling frequency fs to obtain a sampled analog input signal $X_{IN}[k]$, and to scale the sampled analog input signal $X_{IN}[k]$ on the basis of a plurality of scaling coefficients, wherein each of the plurality of discrete points in time k corresponds to the sampling frequency, and wherein the plurality of scaling coefficients are provided by the scaler on the basis of a control code n stored in the scaler, and wherein the control code n is a function of the plurality of discrete points in time k, n[k];

a transfer switch, configured to transfer the sampled input signal $X_{IN}[k]$ to an output signal $X_{OUT}[k]$, based on a second clock signal; and a reset switch, configured to reset a common mode DC voltage of the mixer based on a third clock signal;

wherein the first clock signal, the second clock signal and the third clock signal are based on a frequency of a local oscillator signal;

wherein the mixer is in a system with a transmitter and a receiver.

2. The mixer of claim 1, wherein the first clock signal, the second signal and the third clock signal have duty cycles of 25%.

3. The mixer of claim 1, further comprising:

a dummy capacitor, wherein the dummy capacitor is coupled between the transfer switch and an output terminal of the mixer.

4. The mixer of claim 1, further comprising: a plurality of unit cells connected in parallel to an input terminal of the mixer, wherein each unit cell of the plurality of unit cells comprises a unit cell capacitor, wherein the unit cell capacitor of an i-th unit cell has a capacitance $C_{ui}$ and wherein a sum of the capacitances of the plurality of unit cells defines a total capacitance $C_s$, and wherein each unit cell of the plurality of unit cells comprises the transfer switch for connecting the unit cell capacitor of the unit cell to the output terminal of the mixer.

5. The mixer of claim 4, wherein the plurality of unit cells comprises N unit cells and wherein the unit cell capacitors have the same capacitance $C_{ui}=C_u$ with $C_u$ being a constant capacitance and the total capacitance $C_s$ is given by $C_s=NC_u$, wherein N is an integer.

6. The mixer of claim 4, wherein the plurality of unit cells comprises b unit cells, wherein the unit cell capacitor of the i-th unit cell has a capacitance $C_{ui}=2^{i-1}C_u$ with $C_u$ being a constant capacitance and the total capacitance $C_s$ is given by $C_s=(2^b-1)C_u$, wherein b is an integer.

7. The mixer of claim 4, wherein the plurality of unit cells comprises (b+K) unit cells, wherein the unit cell capacitor of the i-th unit cell of the b unit cells of the plurality of unit cells has a capacitance $C_{ui}=2^{i-1}C_u$ with $C_u$ being a constant capacitance, and wherein the unit cell capacitors of the K remaining unit cells of the plurality of unit cells have the same capacitance $C_{ui}=2^b C_u$ and the total capacitance $C_s$ is given by $C_s=(2^b K+2^b-1)C_u$, wherein b and K are each integers.

8. The mixer of claim 4, wherein the input terminal comprises a positive input terminal and a negative input terminal and wherein an output terminal comprises a positive output terminal and a negative output terminal and wherein each unit cell of the plurality of unit cells comprises a plurality of switches, wherein each side of the unit cell capacitor of a unit cell of the plurality of unit cells can be connected to the positive output terminal and/or the negative output terminal through the plurality of switches.

9. The mixer of claim 4, wherein a fraction of the total capacitance $C_s$ is configured to be connected to the output terminal of the mixer based on control code.

10. The mixer of claim 4, wherein the mixer comprises $2^M$ blocks of unit cells, wherein M is an integer and wherein each block of unit cells is configured to sample the sampled analog input signal with a different phase, and wherein each block uses a different set of scaling factors.

11. The mixer of claim 1, wherein the sampling frequency $f_S$ of the mixer is equal to four times of a local oscillator frequency $f_{LO}$.

* * * * *